United States Patent
Song

(10) Patent No.: US 11,621,353 B2
(45) Date of Patent: Apr. 4, 2023

(54) SEMICONDUCTOR DEVICES AND METHODS OF FABRICATING THE SAME

(71) Applicant: Samsung Electronics Co., Ltd., Suwon-si (KR)

(72) Inventor: Woo Bin Song, Hwaseong-si (KR)

(73) Assignee: Samsung Electronics Co., Ltd.

( * ) Notice: Subject to any disclaimer, the term of this patent is extended or adjusted under 35 U.S.C. 154(b) by 40 days.

(21) Appl. No.: 17/180,940

(22) Filed: Feb. 22, 2021

(65) Prior Publication Data

US 2021/0391467 A1 Dec. 16, 2021

(30) Foreign Application Priority Data

Jun. 12, 2020 (KR) .................. 10-2020-0071770

(51) Int. Cl.
*H01L 29/78* (2006.01)
*H01L 29/423* (2006.01)
*H01L 29/10* (2006.01)

(52) U.S. Cl.
CPC ...... *H01L 29/7855* (2013.01); *H01L 29/1033* (2013.01); *H01L 29/42364* (2013.01)

(58) Field of Classification Search
CPC ............. H01L 29/7855; H01L 29/1033; H01L 29/42364; H01L 29/66045; H01L 29/66969; H01L 29/0665; H01L 29/78648; H01L 29/1606; H01L 29/24; H01L 29/778; H01L 29/78681; H01L 29/78696; H01L 21/02587; H01L 29/42392; H01L 29/66772; H01L 21/823437–823456; H01L 29/66484; H01L 21/823842

See application file for complete search history.

(56) References Cited

U.S. PATENT DOCUMENTS

| | | | |
|---|---|---|---|
| 10,038,096 B2 | 7/2018 | Zang et al. | |
| 10,177,041 B2 | 1/2019 | Xie et al. | |
| 10,333,001 B2 | 6/2019 | Huang et al. | |
| 10,340,367 B2 | 7/2019 | Lin et al. | |
| 10,490,631 B2 | 11/2019 | Lu et al. | |
| 10,559,564 B2 | 2/2020 | Rosenblatt et al. | |
| 2013/0264630 A1* | 10/2013 | Kim | H01L 29/792 257/321 |
| 2019/0103496 A1 | 4/2019 | Colinge et al. | |
| 2019/0378911 A1* | 12/2019 | Lee | H01L 29/0673 |
| 2020/0006337 A1 | 1/2020 | Yeo et al. | |
| 2020/0373454 A1* | 11/2020 | Kallioinen | H01L 31/1136 |

* cited by examiner

*Primary Examiner* — Shahed Ahmed

(74) *Attorney, Agent, or Firm* — Myers Bigel, P.A.

(57) ABSTRACT

Semiconductor devices having improved electrical characteristics are described, as are methods of fabricating the same. The semiconductor device may include a first gate electrode on a substrate and extending in a first direction, a second gate electrode on the substrate and running across the first gate electrode while extending in a second direction, and a channel structure between the second gate electrode and lateral surfaces in the second direction of the first gate electrode and between the second gate electrode and a top surface of the first gate electrode. The channel structure may include a first dielectric layer that covers in contact with the lateral surfaces and the top surface of the first gate electrode; a second dielectric layer on the first dielectric layer and in contact with the second gate electrode; and a channel layer between the first dielectric layer and the second dielectric layer.

19 Claims, 25 Drawing Sheets

SEMICONDUCTOR DEVICES AND METHODS OF FABRICATING THE SAME

CROSS-REFERENCE TO RELATED APPLICATION

This U.S. nonprovisional application claims priority under 35 U.S.C § 119 to Korean Patent Application No. 10-2020-0071770, filed on Jun. 12, 2020, in the Korean Intellectual Property Office, the disclosure of which is hereby incorporated by reference in its entirety.

BACKGROUND

The present inventive concepts relate to semiconductor devices and to methods of fabricating the same, and more particularly, to semiconductor devices including gate-all-around type transistors and methods of fabricating the same.

Semiconductor devices are beneficial in the electronic industry because of their small size, multi-functionality, and/or low fabrication cost. Semiconductor devices may encompass semiconductor memory devices storing logic data, semiconductor logic devices processing operations of logic data, and hybrid semiconductor devices having both memory and logic elements. Semiconductor devices have been increasingly required for high integration with the advanced development of the electronic industry. For example, semiconductor devices have been increasingly requested for high reliability, high speed, and/or multi-functionality. Semiconductor devices are gradually complicated and integrated to meet these requested characteristics.

SUMMARY

Some aspects of the present inventive concepts provide semiconductor devices with improved electrical characteristics and methods of fabricating the same.

The objects of the present inventive concepts are not limited to those explicitly mentioned herein, and other objects which are not been mentioned herein will be clearly understood to those skilled in the art from the following description.

According to some example embodiments of the present inventive concepts, a semiconductor device may comprise: a first gate electrode on a substrate, the first gate electrode extending in a first direction; a second gate electrode on the substrate, the second gate electrode running across the first gate electrode and extending in a second direction; and a channel structure between the second gate electrode and lateral surfaces of the first gate electrode and between the second gate electrode and a top surface of the first gate electrode. The channel structure may include: a first dielectric layer in contact with the lateral surfaces and the top surface of the first gate electrode; a second dielectric layer in contact with the second gate electrode; and a channel layer between the first dielectric layer and the second dielectric layer.

According to some example embodiments of the present inventive concepts, a method of fabricating a semiconductor device may comprise: forming an active pattern on a substrate, wherein the active pattern protrudes from the substrate and extends in a first direction; forming a channel layer on lateral surfaces and a top surface of the active pattern; partially removing an upper portion of the active pattern to form an internal space, the upper portion being covered with the channel layer; arranging a plurality of dielectric layers on an inner surface and an outer surface of the channel layer to form a channel structure, wherein the inner surface is directed toward the inner surface, and wherein the outer surface is opposite to the inner surface; and forming a first gate electrode that fills the internal space and a second gate electrode that covers the channel structure.

According to some example embodiments of the present inventive concepts, a semiconductor device may comprise: an active pattern that extends in a first direction on a substrate; a first gate electrode that extends in the first direction on the active pattern; a second gate electrode that runs across the first gate electrode and that covers lateral surfaces and a top surface of the first gate electrode; a plurality of gate spacers that cover lateral surfaces of the second gate electrode; a first channel layer between the first gate electrode and the second gate electrode; a plurality of dielectric layers between the first channel layer and the first gate electrode and between the first channel layer and the second gate electrode; and a plurality of source/drain patterns that are spaced apart from each other across the first gate electrode and are connected to other through the first channel layer.

According to some example embodiments of the present inventive concepts, a semiconductor device may comprise: a first active pattern and a second active pattern that extend in a first direction on a substrate and are spaced apart from each other in a second direction that intersects the first direction; a first gate electrode that extends in the first direction on the first active pattern; a second gate electrode that extends in the first direction on the second active pattern; a third gate electrode that runs across the first gate electrode and the second gate electrode; a first channel layer between the first gate electrode and the second gate electrode, wherein the first channel layer covers lateral surfaces and a top surface of the first gate electrode; a plurality of first dielectric layers between the first channel layer and the first gate electrode and between the first channel layer and the third gate electrode; a second channel layer between the second gate electrode and the third gate electrode, wherein the second channel layer covers lateral surfaces and a top surface of the second gate electrode; and a plurality of second dielectric layers between the second channel layer and the second gate electrode and between the second channel layer and the third gate electrode.

DETAILED DESCRIPTION

The following will now describe a semiconductor device according to the present inventive concepts with reference to accompanying drawings.

Figure 1:
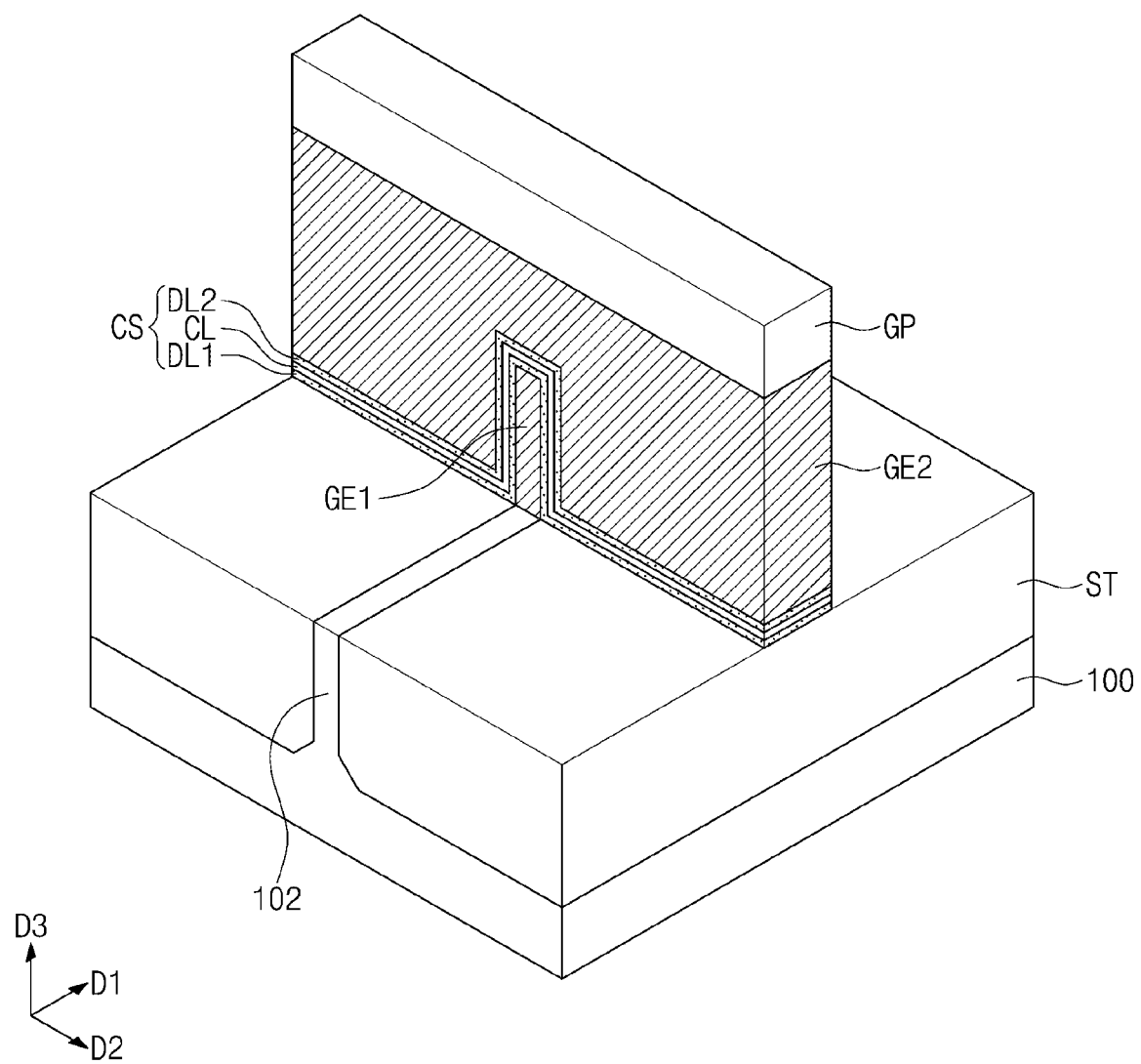
FIG. 1 illustrates a perspective view showing aspects of a semiconductor device according to some example embodiments of the present inventive concepts.
Figure 2:
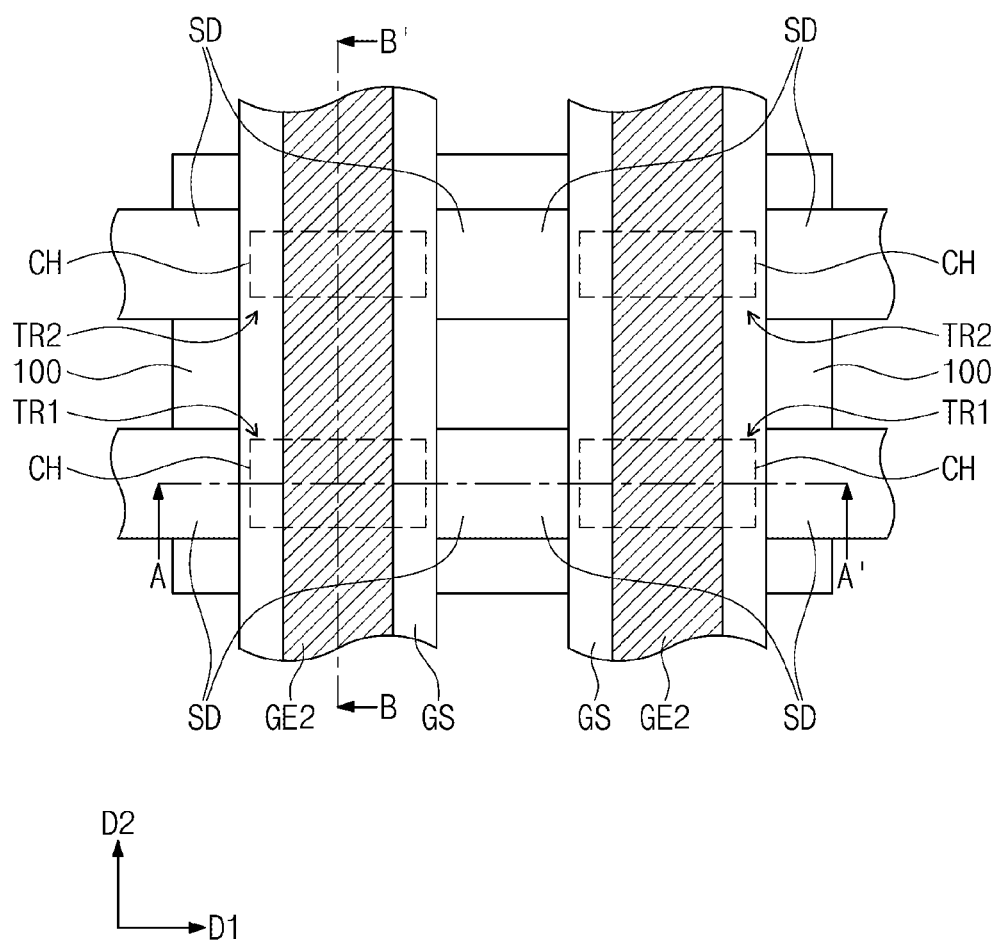
FIG. 2 illustrates a plan view showing aspects of a semiconductor device according to some example embodiments of the present inventive concepts.
Figure 3:
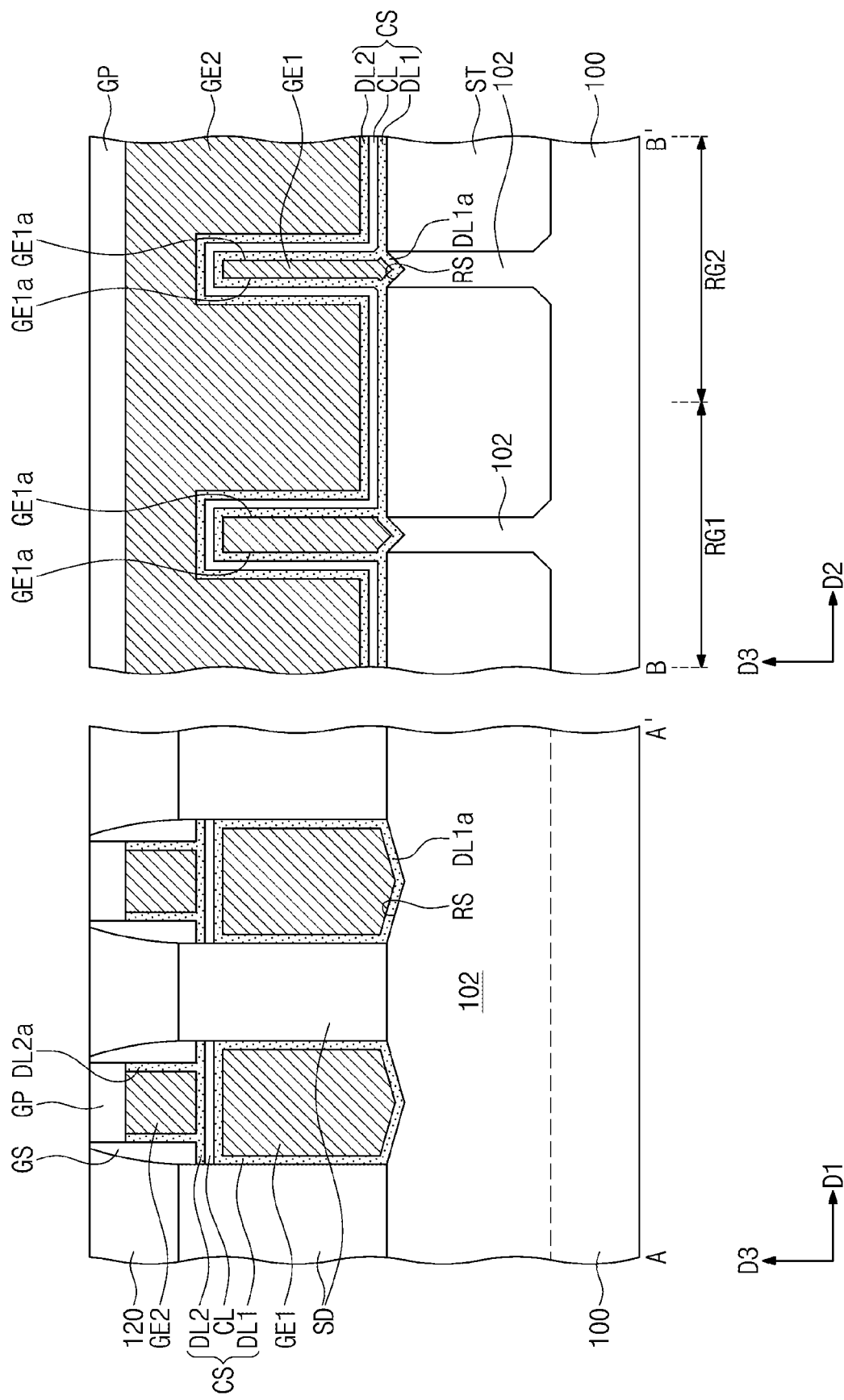
FIG. 3 illustrates cross-sectional views showing aspects of a semiconductor device according to some example embodiments of the present inventive concepts.

FIG. 1 illustrates a simplified perspective view of aspects of a semiconductor device according to some example embodiments of the present inventive concepts, and in particular illustrates a transistor of the semiconductor device. For convenience of description, FIG. 1 omits illustration of some components (e.g., a portion of each of first and second gate dielectric layers). FIG. 2 illustrates a plan view showing a semiconductor device according to some example embodiments of the present inventive concepts. FIG. 3 illustrates cross-sectional views taken along lines A-A' and B-B' of FIG. 2, and shows a semiconductor device according to some example embodiments of the present inventive concepts.

Referring to FIGS. 1 to 3, a substrate 100 may be provided which includes a first region RG1 and a second region RG2. The substrate 100 may be a semiconductor substrate. For example, the substrate 100 may be a silicon (Si) substrate or a germanium (Ge) substrate. Alternatively, the substrate 100 may be a silicon-on-insulator (SOI) substrate. The first and second regions RG1 and RG2 of the substrate 100 may be arranged in parallel along a second direction D2. The first region RG1 of the substrate 100 may be defined to refer to an area on which first transistors TR1 are provided, and the second region RG2 of the substrate 100 may be defined to refer to an area on which second transistors TR2 are provided.

Herein, the first and second directions D1 and D2 are each defined to indicate a direction parallel to a top surface of the substrate 100, and a third direction D3 is defined to indicate a direction perpendicular to the top surface of the substrate 100. The first and second directions D1 and D2 may be perpendicular or substantially perpendicular to each other.

According to some example embodiments, each of the first and second regions RG1 and RG2 of the substrate 100 may be a memory cell region. A memory cell region may be a region of the substrate 100 on which a plurality of memory cells for storing data are provided. For example, the memory cell region of the substrate 100 may include memory cell transistors that constitute a plurality of SRAM cells. The first and second transistors TR1 and TR2 may be some of the memory cell transistors.

According to some example embodiments, each of the first and second regions RG1 and RG2 of the substrate 100 may be a logic cell region. A logic cell region may be a region of the substrate 100 where logic transistors that are included in one or more logic circuits of a semiconductor device are arranged. For example, logic transistors may be arranged on the logic cell region of the substrate 100. The first and second transistors TR1 and TR2 may be some of the logic transistors. However, the present disclosure is not limited by the example embodiments of the present inventive concepts provided herein.

The first and second transistors TR1 and TR2 on the first and second regions RG1 and RG2 may have threshold voltages and/or work functions that are different from each other, as discussed in greater detail herein.

A base active pattern 102 may be provided on the substrate 100. The base active pattern 102 may protrude in the third direction D3 from the substrate 100. The base active pattern 102 may extend in the first direction D1. As shown in FIGS. 2 and 3, the base active pattern 102 may be provided in plural, and the plurality of base active patterns 102 may be arranged in the second direction D2. The base active patterns 102 may be spaced apart from each other in the second direction D2.

The base active patterns 102 may have top surfaces on which concave, recessed, and/or indented portions RS are provided. For example, the recessed portions RS formed on the top surfaces of the base active patterns 102 may be directed toward the substrate 100. The recessed portions RS of the base active patterns 102 may be V-shaped and/or may have a V-shape when viewed in a cross-section. The recessed portions RS may have inclined surfaces that are parallel to corresponding crystal faces of a material (e.g., silicon (Si)) included in the base active pattern 102.

The substrate 100 may be provided thereon with a device isolation layer ST on opposite sides in the second direction D2 of each of the base active patterns 102. The device isolation layer ST may extend in the first direction D1. The device isolation layer ST may fill a space between the base active patterns 102. The device isolation layer ST may have a top surface at a level the same as or higher than that of uppermost surfaces of the base active patterns 102. The device isolation layer ST may include oxide, nitride, or oxynitride, as examples.

First gate electrodes GE1 may be provided on the base active patterns 102. When viewed in a plan view, the first gate electrodes GE1 may be provided so as to overlap the base active patterns 102. The first gate electrodes GE1 may have linear shapes that extend in the first direction D1. For example, each of the first gate electrodes GE1 may extend in the first direction D1 along the top surface of one of the base active patterns 102. The first gate electrodes GE1 may protrude or extend in the third direction D3 above the top surface of the device isolation layer ST. The first gate electrodes GE1 may have their bottom surfaces that face the top surfaces of the base active patterns 102. The first gate electrodes GE1 may be at least partially within the recessed portions RS on the top surfaces of the base active patterns 102. As best seen in FIG. 3, on a region where the first gate electrode GE1 is adjacent to the base active pattern 102, opposite lateral surfaces GE1a in the second direction D2 of the first gate electrode GE1 may be vertically aligned with opposite lateral surfaces in the second direction D2 of the base active pattern 102. Widths of the first gate electrodes GE1 on the first regions RG1 may be greater than widths of the first gate electrodes on the second regions RG2. For example, as best seen in FIG. 3, on the first regions RG1, the first gate electrodes GE1 may have widths in the second direction D2 that are the same as widths in the second direction D2 of the base active patterns 102. On the second regions RG2, the first gate electrodes GE1 may have widths in the second direction D2 that are less than widths in the second direction D2 of the base active patterns 102. The first gate electrodes GE1 may include a low-resistance metal, such as aluminum (Al), tungsten (W), titanium (Ti), or tantalum (Ta), as examples.

Second gate electrodes GE2 may be provided on the base active patterns 102. The second gate electrodes GE2 may extend in the second direction D2, while running across or crossing over the first gate electrodes GE1 on the first and second regions RG1 and RG2. The second gate electrodes GE2 may have bottom surfaces that extend along the top surface of the device isolation layer ST, the opposite lateral surfaces GE1a in the second direction D2 of the first gate electrodes GE1, and the top surfaces of the first gate electrodes GE1. For example, the second gate electrodes GE2 may partially cover the top surface of the device isolation layer ST, the opposite lateral surfaces GE1a in the second direction D2 of the first gate electrodes GE1, and the top surfaces of the first gate electrodes GE1. The second gate electrode GE2 may have a width in the first direction D1 that is less than a width in the first direction D1 of the first gate electrode GE1. The second gate electrodes GE2 may be spaced apart from each other in the first direction D1. The second gate electrodes GE2 may include the same material as that of the first gate electrodes GE1. For example, the second gate electrodes GE2 may include a low-resistance metal, such as aluminum (Al), tungsten (W), titanium (Ti), or tantalum (Ta).

Gate capping patterns GP may be arranged on the second gate electrodes GE2. When viewed in a plan view, the gate capping patterns GP may be provided so as to overlap the second gate electrodes GE2. The gate capping patterns GP may have linear shapes that extend along the second direction D2. For example, each of the gate capping patterns GP may extend in the second direction D2 along a top surface of one of the second gate electrodes GE2. The gate capping patterns GP may include at least one selected from a silicon oxide layer, a silicon nitride layer, and a silicon oxynitride layer, as examples.

Channel structures CS may be provided between the first gate electrodes GE1 and the second gate electrodes GE2. The channel structures CS may be interposed between the second gate electrodes GE2 and the lateral surfaces GE1a of the first gate electrodes GE1, and between the second gate electrodes GE2 and the top surfaces of the first gate electrodes GE1. When viewed in a cross-section taken along a plane perpendicular to the first direction D1, and as seen in FIG. 3, the channel structures CS may each be shaped like H extending along the lateral surfaces GE1a and the top surface of the first gate electrode GE1. The channel structures CS may extend in the second direction D2. Each of the channel structures CS may extend from a gap between the second gate electrode GE2 and the opposite lateral surfaces GE1a of the first gate electrode GE1 to a gap between the second gate electrode GE2 and the device isolation layer ST. As the top surface of the device isolation layer ST is located at a level the same as or higher than that of the uppermost surfaces of the base active patterns 102, lowermost ends of the channel structures CS may be located at a higher level than that of the top surfaces of the base active patterns 102.

Each of the channel structures CS may include a first gate dielectric layer DL1, a channel layer CL, and a second gate dielectric layer DL2 that are sequentially stacked in a direction from the first gate electrode GE1 toward the second gate electrode GE2. Stated differently, the first gate dielectric layer DL1 of the channel structure CS may be more proximate to the first gate electrode GE1, and the second gate dielectric layer DL2 of the channel structure CS may be more proximate to the second gate electrode GE2.

The first gate dielectric layer DL1 may cover and conform to (e.g., conformally cover) the lateral surfaces GE1a and the top surface of the first gate electrode GE1. The first gate dielectric layer DL1 may contact the lateral surfaces GE1a and the top surface of the first gate electrode GE1, and may extend along the second direction D2 to cover a portion of the top surface of the device isolation layer ST. In addition, the first gate dielectric layer DL1 may have a portion DL1a that extends between the first gate electrode GE1 and the base active pattern 102. The first gate dielectric layer DL1 may cover opposite ends or opposite sides in the first direction D1 of the first gate electrode GE1. The first gate electrode GE1 may be surrounded by the first gate dielectric layer DL1.

The second gate dielectric layer DL2 may cover the bottom surface of the second gate electrode GE2. In addition, the second gate dielectric layer DL2 may have a portion DL2a that extends between the second gate electrode GE2 and gate spacers GS which will be discussed. The second gate dielectric layer DL2 may cover opposite lateral surfaces in the first direction D1 of the second gate electrode GE2.

The first and second gate dielectric layers DL1 and DL2 may include a high-k dielectric material whose dielectric constant is greater than that of silicon oxide. For example, the high-k dielectric material may include at least one selected from hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate, as examples.

The channel layer CL may be interposed between the first gate dielectric layer DL1 and the second gate dielectric layer DL2. The first gate dielectric layer DL1 may separate and insulate the channel layer CL from the first gate electrode GE1. For example, the first gate dielectric layer DL1 may be interposed between the channel layer CL and the first gate electrode GE1 and between the channel layer CL and the device isolation layer ST. The second gate dielectric layer DL2 may separate and insulate the channel layer CL from the second gate electrode GE2. For example, the second gate dielectric layer DL2 may be interposed between the channel layer CL and the second gate electrode GE2.

The channel layer CL may cover the first gate electrode GE1, and may be covered with the second gate electrode GE2. For example, when viewed in a cross-section taken along a plane perpendicular to the first direction D1, the channel layer CL may be shaped like H extending along the lateral surfaces GE1a and the top surface of the first gate electrode GE1. In some embodiments, the first gate electrode GE1 and the second gate electrode GE2 may surround the channel layer CL. Stated differently, the channel layer CL may penetrate between the first gate electrode GE1 and the second gate electrode GE2, and may have opposite ends that correspondingly protrude from opposite sidewalls of the second gate electrode GE2. In brief, the channel layer CL, the first and second gate dielectric layers DL1 and DL2, and the first and second gate electrodes GE1 and GE2 may define the transistors TR1 and TR2, each of which is a gate-all-around type field effect transistor that includes a channel region whose outer surface is surrounded by the first and second gate electrodes GE1 and GE2. A semiconductor device comprising the transistors TR1 and TR2 according to the present inventive concepts may exhibit an increase and/or improvement in desired electrical characteristics. Moreover, the transistors TR1 and TR2 may have channels whose areas are large or larger. For example, the channel layers CL may have portions positioned on the lateral surfaces GE1a and the top surface of the first gate electrode GE1, and the portions of the channel layers CL may be used as channels CH of the first and second transistors TR1 and TR2. The channel CH, a portion of the channel layer CL, may not have a planar shape but have a three-dimensional structure that covers the top and lateral surfaces of the first gate electrode GE1. Therefore, the channel CH may have a large area on a narrow region. Accordingly, the channel CH formed at the channel layer CL may have low resistance and high charge mobility. As a result, a semiconductor device according to the present inventive concepts may have improved and/or increased gate controllability.

The channel layer CL may include a two-dimensional semiconductor material. For example, the channel layer CL may have a two-dimensional crystal structure. In this description, a two-dimensional crystal structure may include a laminated crystal structure in which atoms are combined with each other only on a two-dimensional plane, and in which the atoms constitute molecular layers between which a Van der Waals bond is weakly formed. Based on a shape of the channel layer CL, a molecular layer of the channel layer CL on the lateral surfaces GE1a of the first gate electrode GE1 may be parallel to the lateral surfaces GE1a of the first gate electrode GE1, and a molecular layer of the channel layer CL on the top surface of the first gate electrode GE1 may be parallel to the top surface of the first gate electrode GE1. For example, the channel layer CL may have a structure in which the molecular layers of the channel layer CL are stacked in directions perpendicular to the lateral surfaces GE1a of the first gate electrode GE1 and to the top surface of the first gate electrode GE1. The channel layer CL may be a mono-molecular layer including a single molecular layer, or the channel layer CL may be a multi-molecular layer including a plurality of molecular layers. The two-dimensional semiconductor material may include graphene, transition metal dichalcogenide (TMD), or phosphorene. The present inventive concepts, however, are not limited thereto, and the channel layer CL may include a material having a two-dimensional crystal structure that may be used as a semiconductor material.

The channel structure CS may be exposed on the lateral surfaces in the first direction D1 of the second gate electrode GE2. For example, the first gate dielectric layer DL1, the channel layer CL, and the opposite ends of the second gate dielectric layer DL2 may be exposed on the opposite lateral surfaces of the second gate electrode GE2.

According to some example embodiments, although not shown, an additional conductive layer may be between the first gate electrode GE1 and the channel structure CS and between the second gate electrode GE2 and the channel structure CS. The additional conductive layer may be provided to adjust a work function of each or one of the first and second transistors TR1 and TR2. The additional conductive layer may include a metal compound whose work function is relatively low. For example, the additional conductive layer may be a metal compound in which aluminum (Al) is doped or contained. Preferably, the additional conductive layer may include titanium aluminum carbide (TiAlC), titanium aluminum nitride (TiAlN), or tantalum aluminum nitride (TaAlN). Alternatively, the additional conductive layer may include metal nitride, such as titanium nitride (TiN), titanium oxynitride (TiON), or tantalum nitride (TaN). The present inventive concepts, however, are not limited thereto.

As best seen in FIG. 3, source/drain patterns SD may be provided on opposite sides in the first direction D1 of the channel structure CS. For example, the source/drain patterns SD may be spaced apart in the first direction D1 from each other across one of the channel structures CS, and the channel layer CL may be interposed between a pair of source/drain patterns SD. The source/drain patterns SD may directly contact sidewalls of the channel layer CL. For example, the channel layer CL may extend in the first direction D1 to connect a pair of neighboring source/drain patterns SD to each other. The first gate dielectric layer DL1 may electrically insulate the source/drain patterns SD from the first gate electrode GE1. In some embodiments, the source/drain patterns SD may be epitaxial patterns that are formed by using the base active patterns 102 as seeds.

The source/drain patterns SD may further include impurities. The impurities may be adopted to improve electrical characteristics of the first and second transistors TR1 and TR2 that include the source/drain patterns SD. For example, the impurities may be phosphorus (P). For another example, the impurities may be boron (B).

The first transistors TR1 may have work functions that are different from those of the second transistors TR2. The first gate electrode GE1 of the second transistor TR2 may have a small width, and thus the channel layer CL on the first gate electrode GE1 may have a small planar area. In this description, the planar area of the channel layer CL may correspond to an area at a top surface of the channel layer CL that covers the lateral surfaces GE1a and the top surface of the first gate electrode GE1. The channel layer CL of the first transistor TR1 may have an area that is greater than that of the channel layer CL of the second transistor TR2, and thus the first and second transistors TR1 and TR2 may have different work functions. Hence, a semiconductor device according to some example embodiments of the present inventive concepts may be configured such that the widths of the first gate electrodes GE1 are used to adjust more easily the effective work functions of transistors, such as transistors in different regions of the semiconductor device.

The second gate electrodes GE2 may have gate spacers GS on sidewalls thereof. The gate spacers GS may extend in the second direction D2 along the sidewalls of the second gate electrodes GE2. The gate spacers GS may have top surfaces that are coplanar with those of the gate capping patterns GP. The source/drain patterns SD may be in contact with the channel layers CL, and may be spaced apart from the second gate electrodes GE2 across the gate spacers GS. The gate spacers GS may electrically insulate the second gate electrodes GE2 from the source/drain patterns SD. The gate spacer GS may be a single layer or a multiple layer. For example, the gate spacer GS may include at least one selected from a silicon nitride layer, a silicon oxynitride layer, and a silicon carbonitride layer.

An interlayer dielectric layer 120 may be provided on at least a portion of a surface of the substrate 100, and may be provided on an entire surface of the substrate 100. The interlayer dielectric layer 120 may cover the device isolation layer ST, the second gate electrodes GE2, and the source/drain patterns SD. The interlayer dielectric layer 120 may have a top surface substantially coplanar with those of the gate capping patterns GP. The interlayer dielectric layer 120 may include silicon oxide (SiO) or silicon oxynitride (SiON).

Although not shown, contacts may be provided to penetrate the interlayer dielectric layer 120 and to have connection with the source/drain patterns SD or the second gate electrodes GE2. The contacts (not shown) may include a metallic material, such as tungsten (W), titanium (Ti), or tantalum (Ta), as examples.

Figure 4:
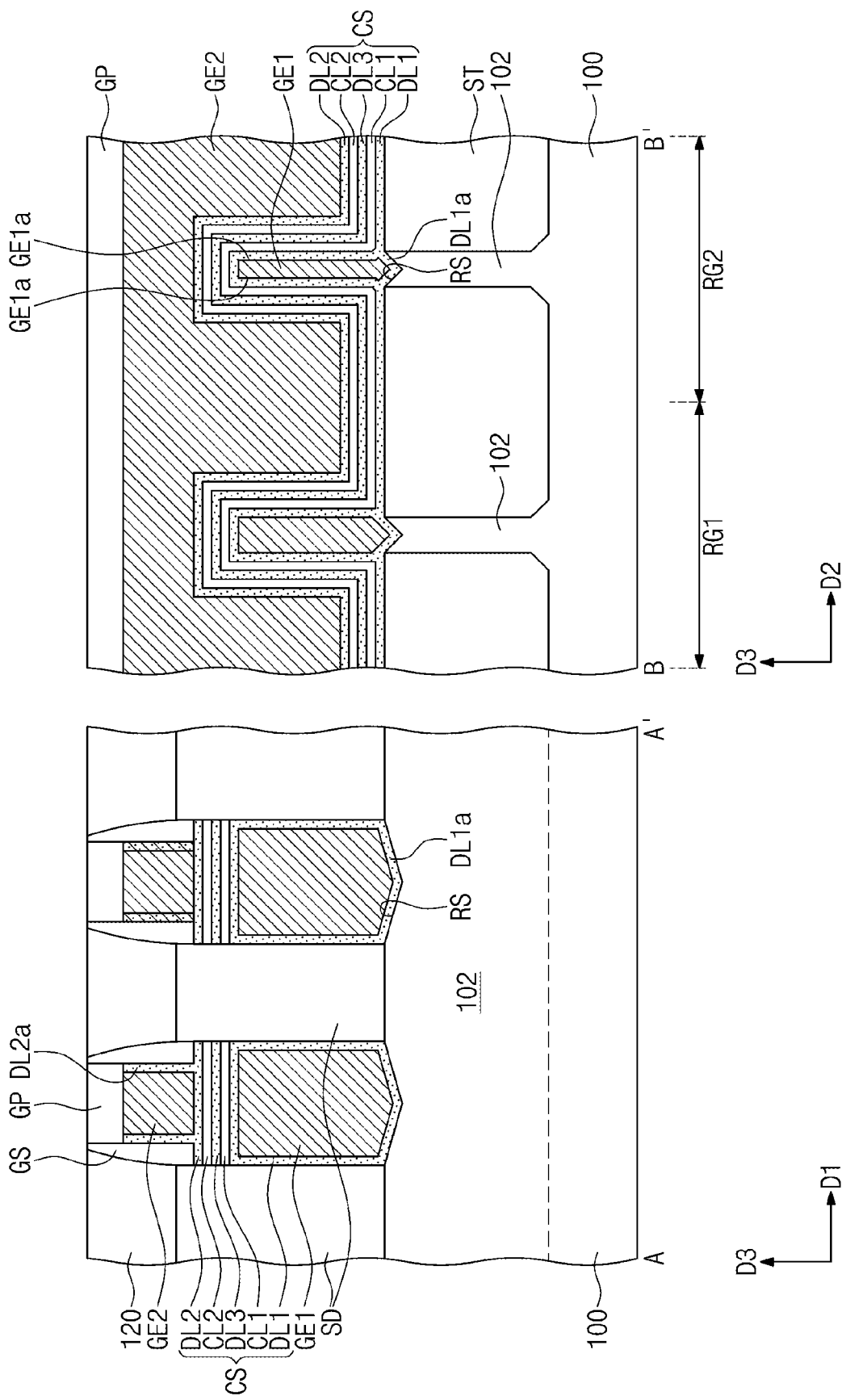
FIGS. 4 to 6 illustrate cross-sectional views showing aspects of a semiconductor device according to some example embodiments of the present inventive concepts.
Figure 5:
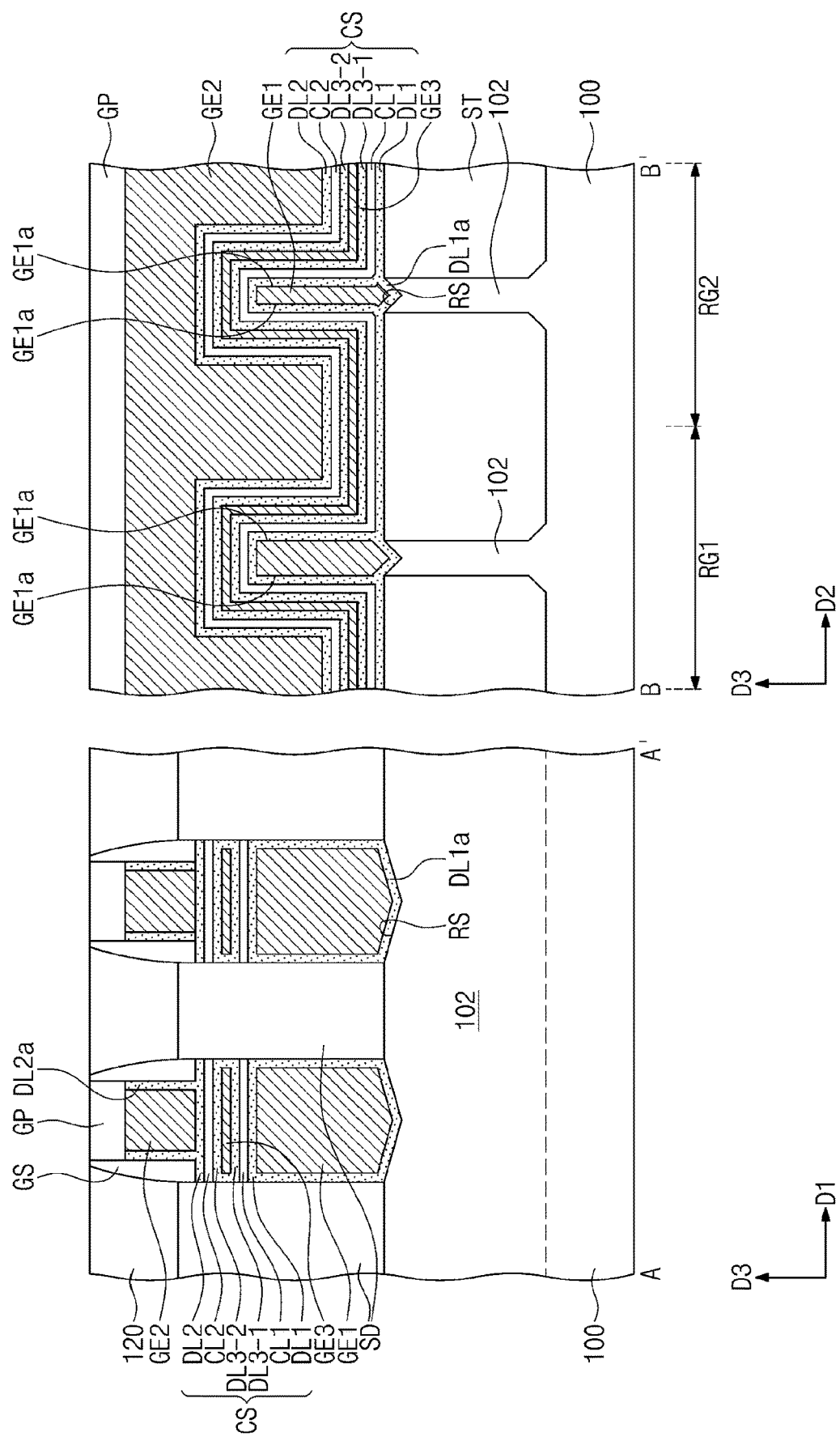

FIGS. 4 and 5 illustrate cross-sectional views showing aspects of a semiconductor device according to some example embodiments of the present inventive concepts. Herein, components the same as those discussed with reference to FIGS. 1 to 3 are allocated the same reference numerals thereto, and a repetitive explanation thereof will be omitted or abridged for convenience of description. The following description will focus on differences between the example embodiments described with reference to FIGS. 1 to 3 and example embodiments described below.

Referring to FIG. 4, each of the channel structures CS may include a first gate dielectric layer DL1, a first channel layer CL1, a middle gate dielectric layer DL3, a second channel layer CL2, and a second gate dielectric layer DL2 that are sequentially stacked in a direction from the first gate electrode GE1 toward the second gate electrode GE2.

The first gate dielectric layer DL1 and the second gate dielectric layer DL2 may be substantially the same as those discussed with reference to FIGS. 1 to 3. For example, the first gate dielectric layer DL1 may cover and conform to the lateral surfaces GE1a and the top surface of the first gate electrode GE1. The first gate dielectric layer DL1 may extend along the second direction D2 and may cover a portion of the top surface of the device isolation layer ST. The first gate dielectric layer DL1 may extend between the first gate electrode GE1 and the base active pattern 102. The second gate dielectric layer DL2 may cover the bottom surface of the second gate electrode GE2. The first and second gate dielectric layers DL1 and DL2 may include a high-k dielectric material whose dielectric constant is greater than that of silicon oxide.

The middle gate dielectric layer DL3 may be provided between the first gate electrode GE1 and the second gate electrode GE2 and between the second gate electrode GE2 and the device isolation layer ST. For example, the middle gate dielectric layer DL3 may be interposed between the first gate dielectric layer DL1 and the second gate dielectric layer DL2. The middle gate dielectric layer DL3 may include the same material as that of the first and second gate dielectric layers DL1 and DL2. The middle gate dielectric layer DL3 may include a high-k dielectric material whose dielectric constant is greater than that of silicon oxide.

The first channel layer CL1 may be interposed between the first gate dielectric layer DL1 and the middle gate dielectric layer DL3. The second channel layer CL2 may be interposed between the middle gate dielectric layer DL3 and the second gate dielectric layer DL2. The first gate dielectric layer DL1 may separate and insulate the first channel layer CL1 from the first gate electrode GE1, and the middle gate dielectric layer DL3 may separate and insulate the first channel layer CL1 from the second channel layer CL2. The middle gate dielectric layer DL3 may separate and insulate the second channel layer CL2 from the first channel layer CL1, and the second gate dielectric layer DL2 may separate and insulate the second channel layer CL2 from the second gate electrode GE2.

Each of the first and second channel layers CL1 and CL2 may include a two-dimensional semiconductor material. Each of the first and second channel layers CL1 and CL2 may have a structure in which molecular layers of each of the first and second channel layers CL1 and CL2 are stacked in a direction perpendicular to the opposite lateral surfaces GE1a and the top surface of the first gate electrode GE1. The two-dimensional semiconductor material may include graphene, transition metal dichalcogenide (TMD), or phosphorene.

According to some example embodiments, and as shown in FIG. 5, third gate electrodes GE3 may be correspondingly provided between the first channel layers CL1 and the second channel layers CL2. The first and second gate electrodes GE1 an GE2 may have therebetween the third gate electrode GE3 that is interposed between the first and second channel layers CL1 and CL2. The third gate electrodes GE3 may include the same material as that of the first and second gate electrodes GE1 and GE2. For example, the third gate electrodes GE3 may include a low-resistance metal, such as aluminum (Al), tungsten (W), titanium (Ti), or tantalum (Ta).

A first middle gate dielectric layer DL3-1 may be interposed between the first channel layer CL1 and the third gate electrode GE3. The first middle gate dielectric layer DL3-1 may separate and insulate the first channel layer CL1 from the third gate electrode GE3. Therefore, the first channel layer CL1 may be a channel of a gate-all-around type transistor in which the first and third gate electrodes GE1 and GE3 surround an outer surface of the first channel layer CL1.

A second middle gate dielectric layer DL3-2 may be interposed between the second channel layer CL2 and the third gate electrode GE3. The second middle gate dielectric layer DL3-2 may separate and insulate the second channel layer CL2 from the third gate electrode GE3. Therefore, the second channel layer CL2 may be a channel of a gate-all-around type transistor in which the second and third gate electrodes GE2 and GE3 surround an outer surface of the second channel layer CL2.

The first and second middle gate dielectric layers DL3-1 and DL3-2 may be sub-dielectric layers of the third dielectric layer DL3. The first and second middle gate dielectric layers DL3-1 and DL3-2 may correspondingly extend onto opposite sides in the first direction D1 of the third gate electrode GE3, and may thus be connected to each other. For example, the first and second middle gate dielectric layers DL3-1 and DL3-2 may surround the third gate electrode GE3, and may electrically insulate the third gate electrode GE3 from the source/drain patterns SD.

As discussed above, a plurality of channel layers CL1 and CL2 may be provided in a gate-all-around type, and a semiconductor device according to the present inventive concepts may exhibit an increase and/or an improvement in desired electrical characteristics.

Figure 6:
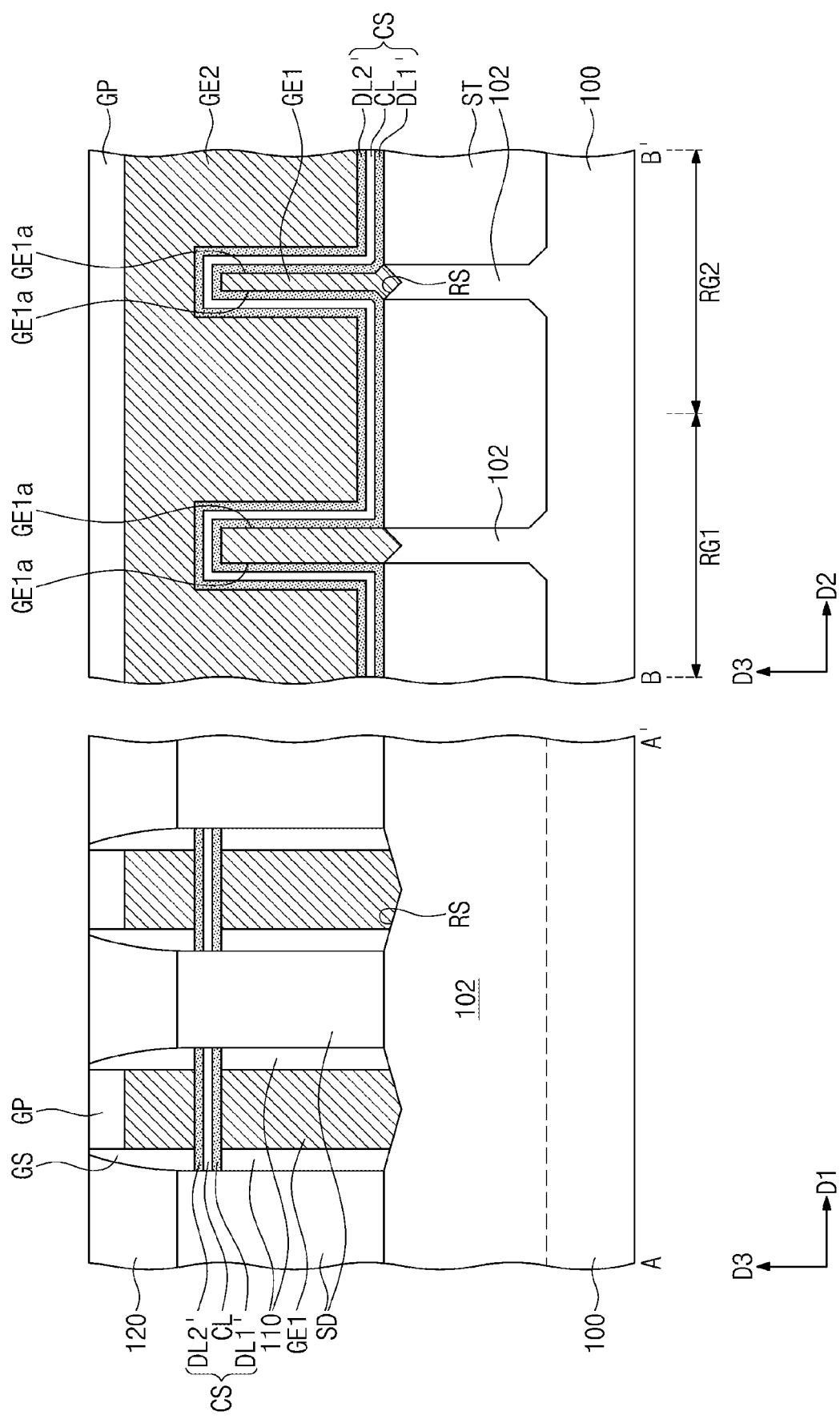

FIG. 6 illustrates a cross-sectional view showing aspects of a semiconductor device according to some example embodiments of the present inventive concepts.

Referring to FIG. 6, the channel structure CS may include a first gate dielectric layer DL1', a channel layer CL, and a second gate dielectric layer DL2' that are sequentially stacked in a direction from the first gate electrode GE1 toward the second gate electrode GE2.

The first gate dielectric layer DL1' may cover and conform to the opposite lateral surfaces GE1a in the second direction D2 and the top surface of the first gate electrode GE1. In contrast to the example embodiments discussed with reference FIGS. 1 to 3, in some example embodiments and as illustrated in FIG. 6, the first gate dielectric layer DL1' may expose opposite ends in the first direction D1 of the first gate electrode GE1. In addition, the first gate dielectric layer DL1' may not extend between the first gate electrode GE1 and the base active pattern 102. Therefore, the first gate electrode GE1 may extend into the recessed portions RS to come into contact with the top surface of the base active pattern 102. The second gate dielectric layer DL2' may cover the bottom surface of the second gate electrode GE2. The first and second gate dielectric layers DL1' and DL2' may include a silicon oxide layer, a silicon nitride layer, or a silicon oxynitride layer, as examples.

The channel layer CL may be interposed between the first gate dielectric layer DL1' and the second gate dielectric layer DL2'. The first gate dielectric layer DL1' may separate and insulate the channel layer CL from the first gate electrode GE1. The second gate dielectric layer DL2' may separate and insulate the channel layer CL from the second gate electrode GE2.

Spacer patterns 110 may be provided. The spacer patterns 110 may be provided between the first gate electrode GE1 and the source/drain patterns SD. For example, the source/drain patterns SD may be provided therebetween with the spacer patterns 110 that are spaced apart in the first direction D1 from each other across one of the first gate electrodes GE1. The spacer patterns 110 may electrically insulate the source/drain patterns SD from the first gate electrode GE1. The spacer patterns 110 may include silicon nitride (SiN), as an example.

FIGS. 7 to 17 illustrate cross-sectional views showing aspects of a method of fabricating a semiconductor device according to some example embodiments of the present inventive concepts.

Figure 7:
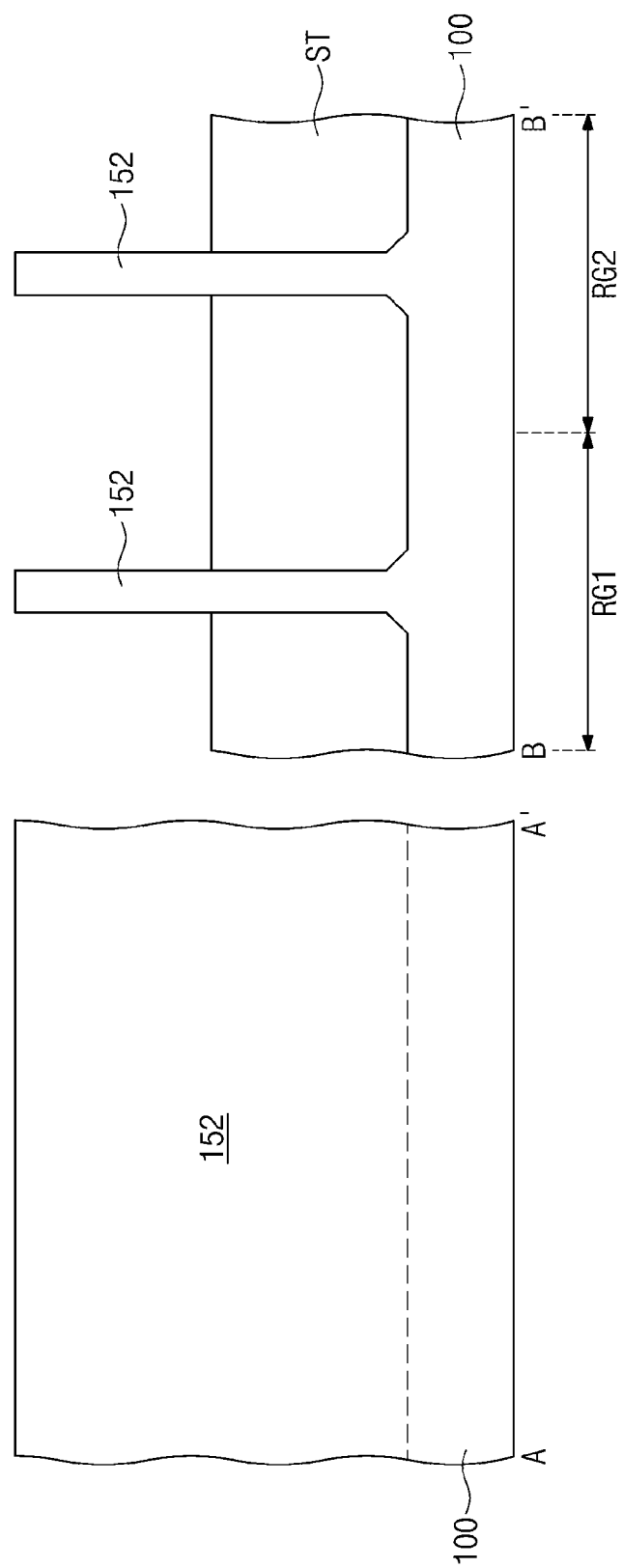
FIGS. 7 to 17 illustrate cross-sectional views showing aspects of a method of fabricating a semiconductor device according to some example embodiments of the present inventive concepts.

Referring to FIG. 7, a substrate 100 may be provided. The substrate 100 may have an active region. The substrate 100 may be a semiconductor substrate. The substrate 100 may have a first region RG1 and a second region RG2 that are defined on the substrate 100. The first region RG1 may be defined as an area on which the first transistors (TR1 of FIG. 1) will be formed, and the second region RG2 may be defined as an area on which the second transistors (see TR2 of FIG. 1) will be formed. In FIGS. 7 to 17, there is no illustration of a boundary at which the first and second regions RG1 and RG2 are in direct contact with each other, and the first and second regions RG1 and RG2 may be electrically separated from each other.

Preliminary active patterns 152 may be formed on the first and second regions RG1 and RG2 of the substrate 100. The preliminary active patterns 152 may have fin shapes. For example, the preliminary active patterns 152 may have linear or bar shapes that extend in a first direction D1 on the substrate 100. The preliminary active patterns 152 may be portions of the substrate 100 or may be formed by etching an epitaxial layer grown from the substrate 100.

A device isolation layer ST may be formed to fill a space between the preliminary active patterns 152. The formation of the device isolation layer ST may include forming a dielectric layer on an entire surface of the substrate 100, and then recessing the dielectric layer until the preliminary active patterns 152 are completely exposed. Accordingly, the device isolation layer ST may have a top surface lower than those of the preliminary active patterns 152.

Figure 8:
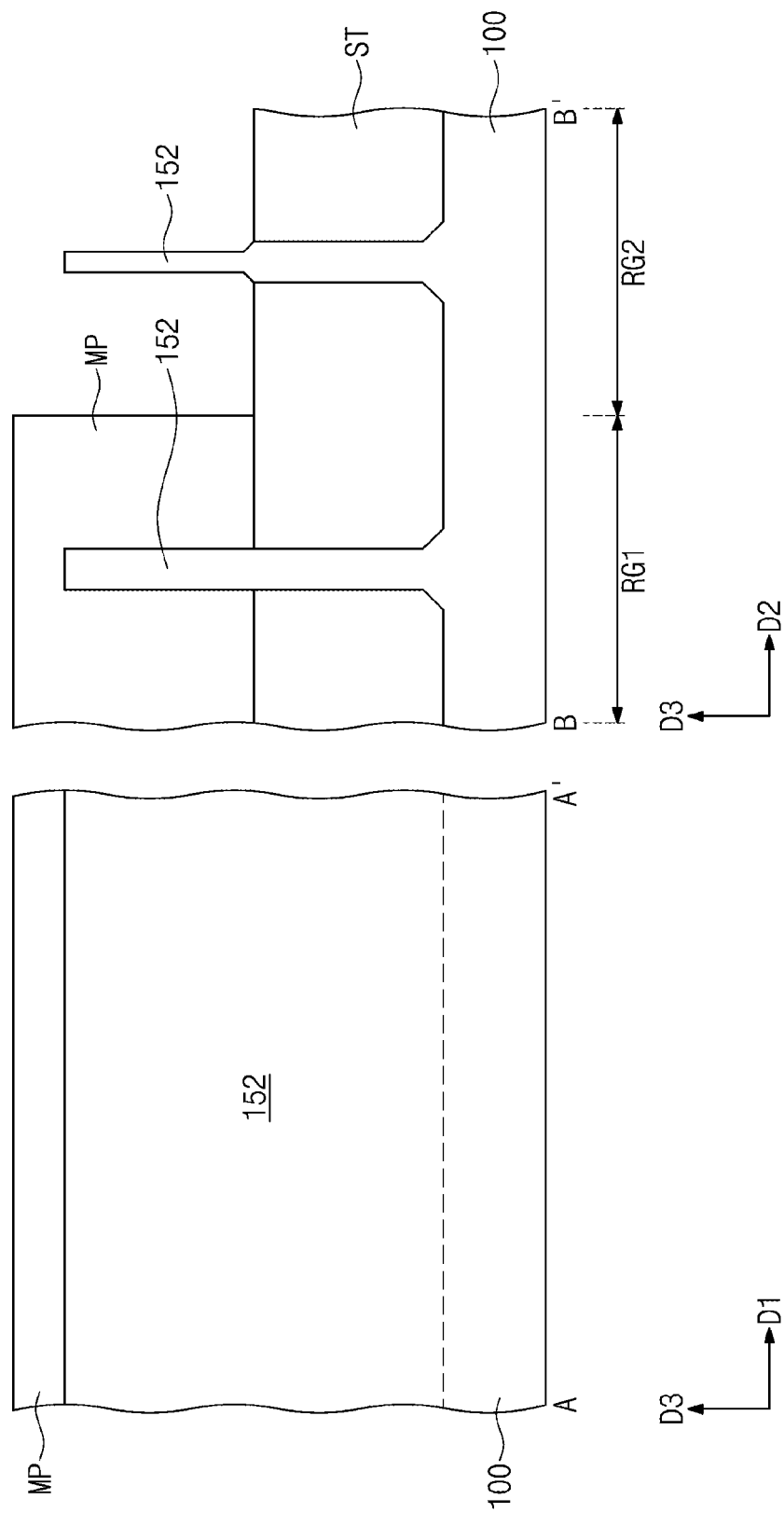

Referring to FIG. 8, widths of the preliminary active patterns 152 on the second region RG2 may be reduced. For example, on the first region RG1 a mask pattern MP may be formed on the substrate 100. The mask pattern MP may cover the preliminary active patterns 152 on the first region RG1, but may expose the preliminary active patterns 152 on the second region RG2. Afterwards, an isotropic etching process may be performed on the preliminary active patterns 152 on the second region RG2. Therefore, the preliminary active patterns 152 on the second region RG2 may have reduced widths in the second direction D2.

Figure 9:
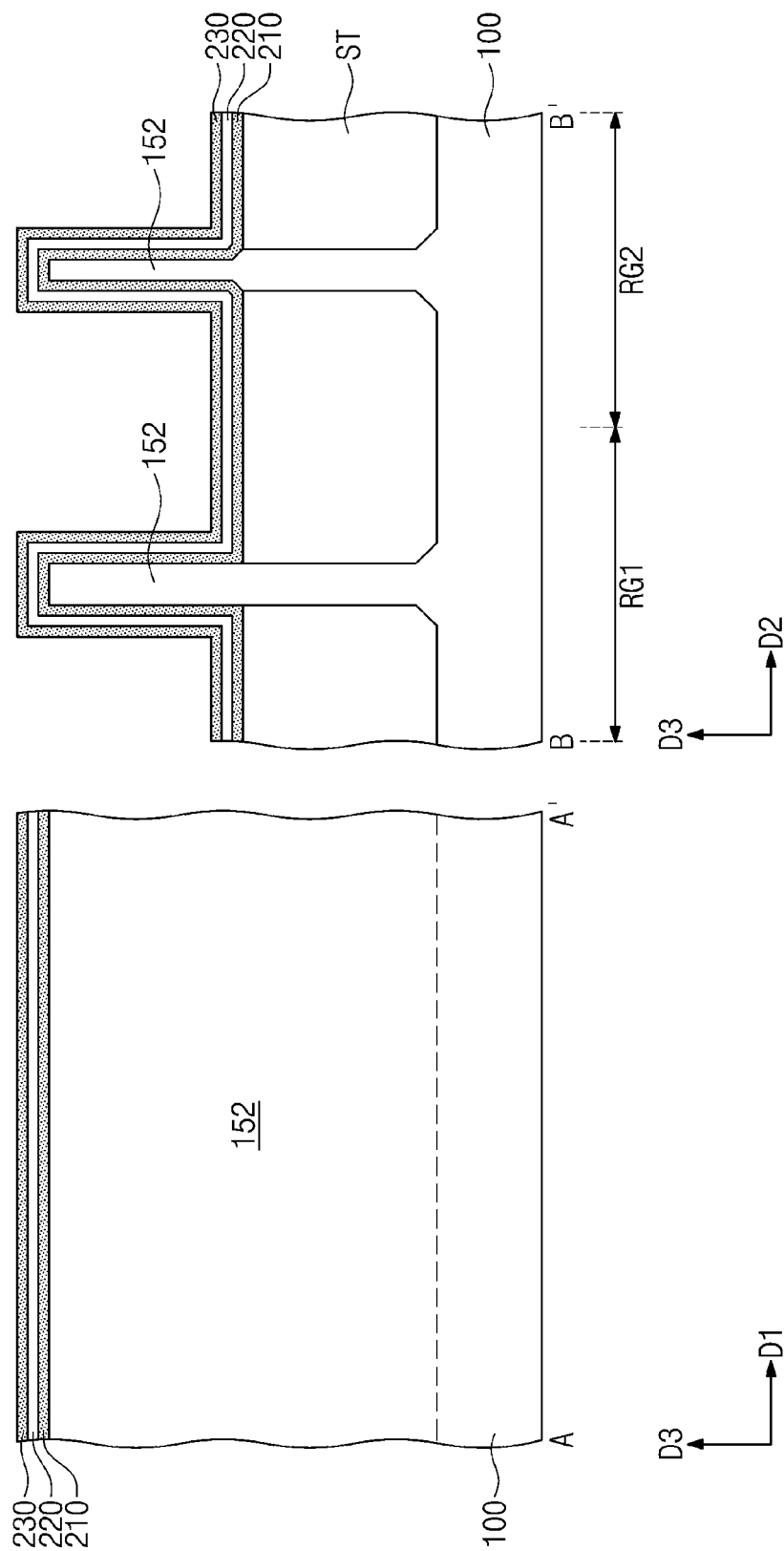

Referring to FIG. 9, a first sacrificial layer 210, a channel layer 220, and a second sacrificial layer 230 may be sequentially stacked on the substrate 100. The first sacrificial layer 210, the channel layer 220, and the second sacrificial layer 230 may be formed to conform to a top surface of the substrate 100. For example, the first sacrificial layer 210, the channel layer 220, and the second sacrificial layer 230 may cover the top surface of the device isolation layer ST, the top surfaces of the preliminary active patterns 152, and lateral surfaces of each of the preliminary active patterns 152 that protrude upwards from the device isolation layer ST. The lateral surfaces of the preliminary active patterns may be opposite lateral surfaces in the second direction D2. The first and second sacrificial layers 210 and 230 may include a material having an etch selectivity with respect to the device isolation layer ST, the preliminary active patterns 152, and the channel layer 220. For example, the first and second sacrificial layers 210 and 230 may include silicon-germanium (SiGe) or germanium (Ge). The channel layer 220 may include a two-dimensional semiconductor material. The channel layer 220 may be formed such that a molecular layer thereof is parallel to the lateral surfaces and the top surface of each of the preliminary active patterns 152. The two-dimensional semiconductor material may include graphene, transition metal dichalcogenide (TMD), or phosphorene.

Figure 10:
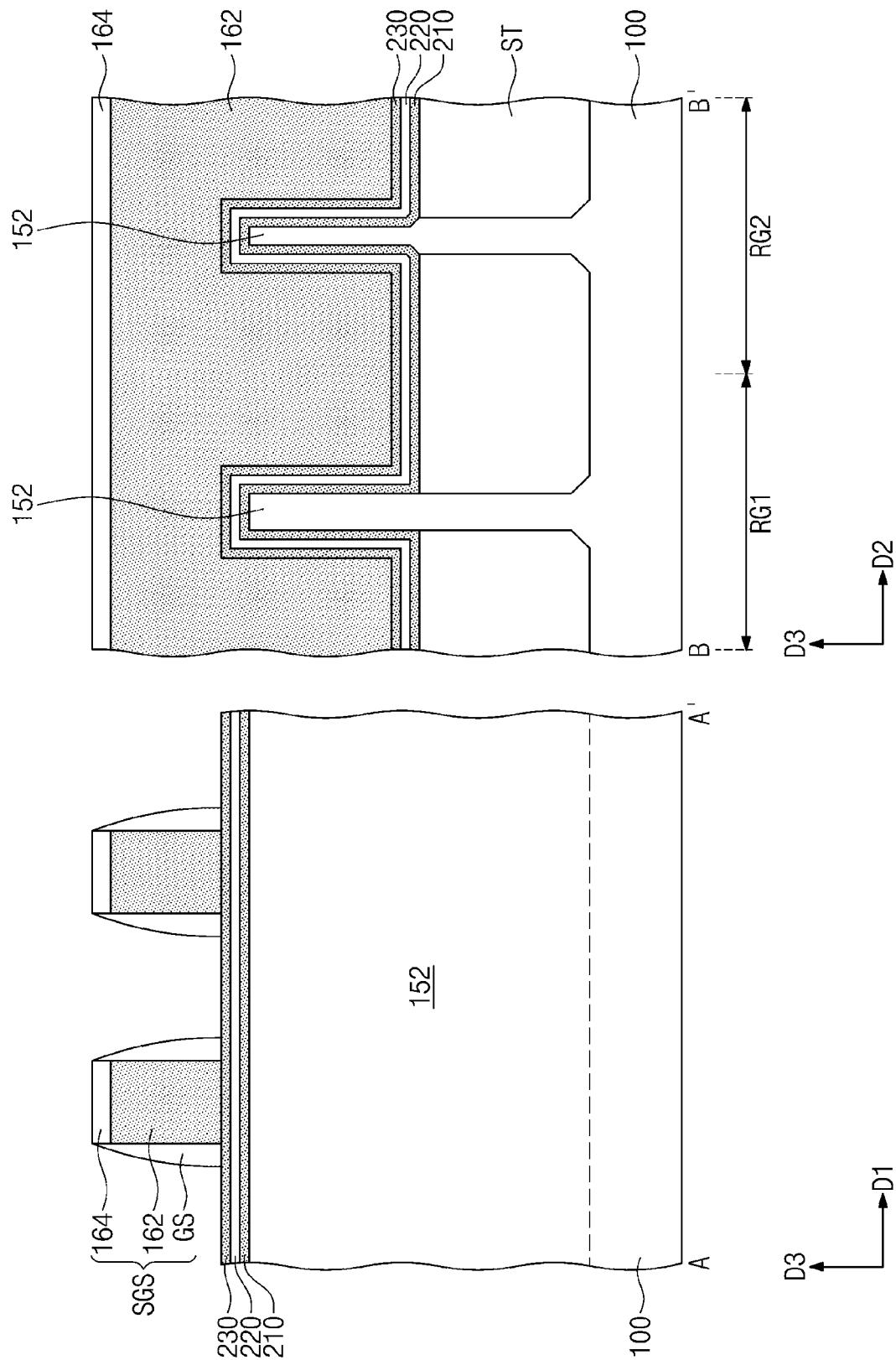

Referring to FIG. 10, sacrificial gate structures SGS may be formed on the second sacrificial layer 230. The sacrificial gate structures SGS may run across the preliminary active patterns 152, while extending in the second direction D2. Each of the sacrificial gate structures SGS may include a sacrificial gate pattern 162 and a gate mask pattern 164 that are sequentially stacked on the second sacrificial layer 230. The sacrificial gate pattern 162 and the gate mask pattern 164 may be formed by sequentially forming a sacrificial gate layer and a gate mask layer on the second sacrificial layer 230, and then sequentially patterning the sacrificial gate layer and the gate mask layer. The sacrificial gate layer may include polysilicon. The gate mask layer may include silicon nitride (SiN) or silicon oxynitride (SiON). The sacrificial gate structures SGS may have linear shapes that extend in the second direction D2. The sacrificial gate structures SGS may cover the lateral surfaces of the preliminary active patterns 152 that are opposite from each other in the second direction D2. The sacrificial gate structures SGS may cover the top surfaces of the preliminary active patterns 152 and the top surface of the device isolation layer ST.

The sacrificial gate structures SGS may further include gate spacers GS. A pair of gate spacers GS may be formed on opposite sidewalls of each of the sacrificial gate structures SGS. The gate spacers GS may be formed by using silicon carbonitride (SiCN), silicon carbon oxynitride (SiCON), or silicon nitride (SiN). The formation of the gate spacers GS may include forming a spacer layer by a deposition process such as CVD or ALD, and then performing an anisotropic etching process on the spacer layer.

Figure 11:
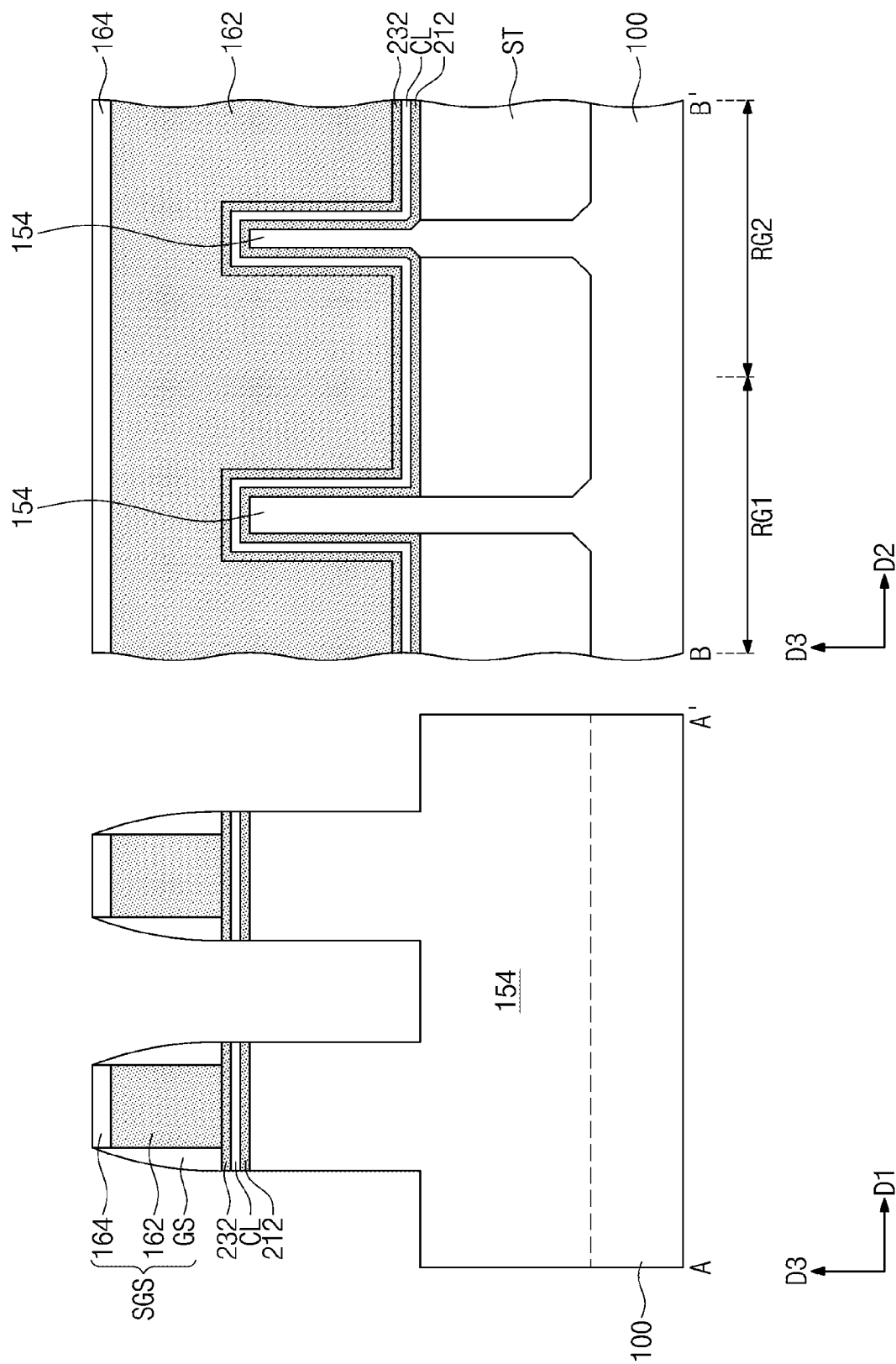

Referring to FIG. 11, the second sacrificial layer 230, the channel layer 220, and the first sacrificial layer 210 may be patterned to form second sacrificial patterns 232, channel layers CL, and first sacrificial patterns 212. The gate mask patterns 164 and the gate spacers GS may be used as an etching mask to pattern the channel layer 220.

For example, the second sacrificial layer 230 may be patterned to form the second sacrificial patterns 232. The patterning of the second sacrificial layer 230 may expose the channel layer 220. The channel layer 220 may be patterned to form the channel layers CL. The patterning of the channel layer 220 may expose the first sacrificial layer 210. The first sacrificial layer 210 may be patterned to form the first sacrificial patterns 212. When the patterning process is performed, the preliminary active patterns 152 may also be partially etched to form active patterns 154. The active patterns 154 may be formed such that the active patterns 154 are at a level the same as or higher than that of the top surface of the device isolation layer ST.

Figure 12:
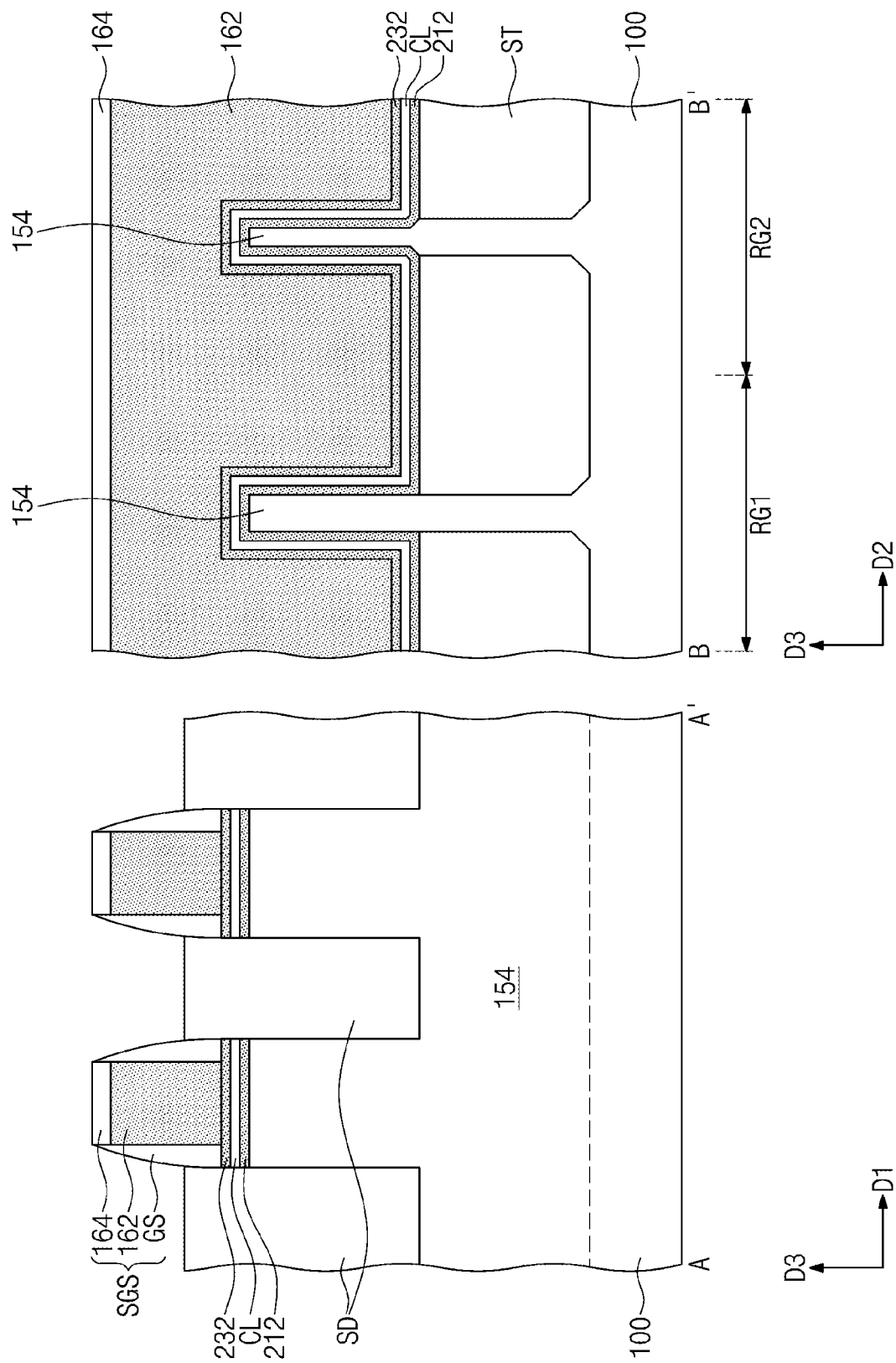

Referring to FIG. 12, source/drain patterns SD may be formed on opposite sides of each of the channel layers CL. For example, a selective epitaxial process may be performed in which the active patterns 154 are used as seeds to form the source/drain patterns SD. The channel layers CL may be connected to the source/drain patterns SD.

In some example embodiments, the source/drain patterns SD may be formed of a semiconductor element (e.g., silicon (Si)) that is the same as that of the active patterns 154. Simultaneously with or after the selective epitaxial process, the source/drain patterns SD may be doped with N-type impurities. Simultaneously with or after the selective epitaxial growth process, the source/drain patterns SD may be doped with P-type impurities.

Figure 13:
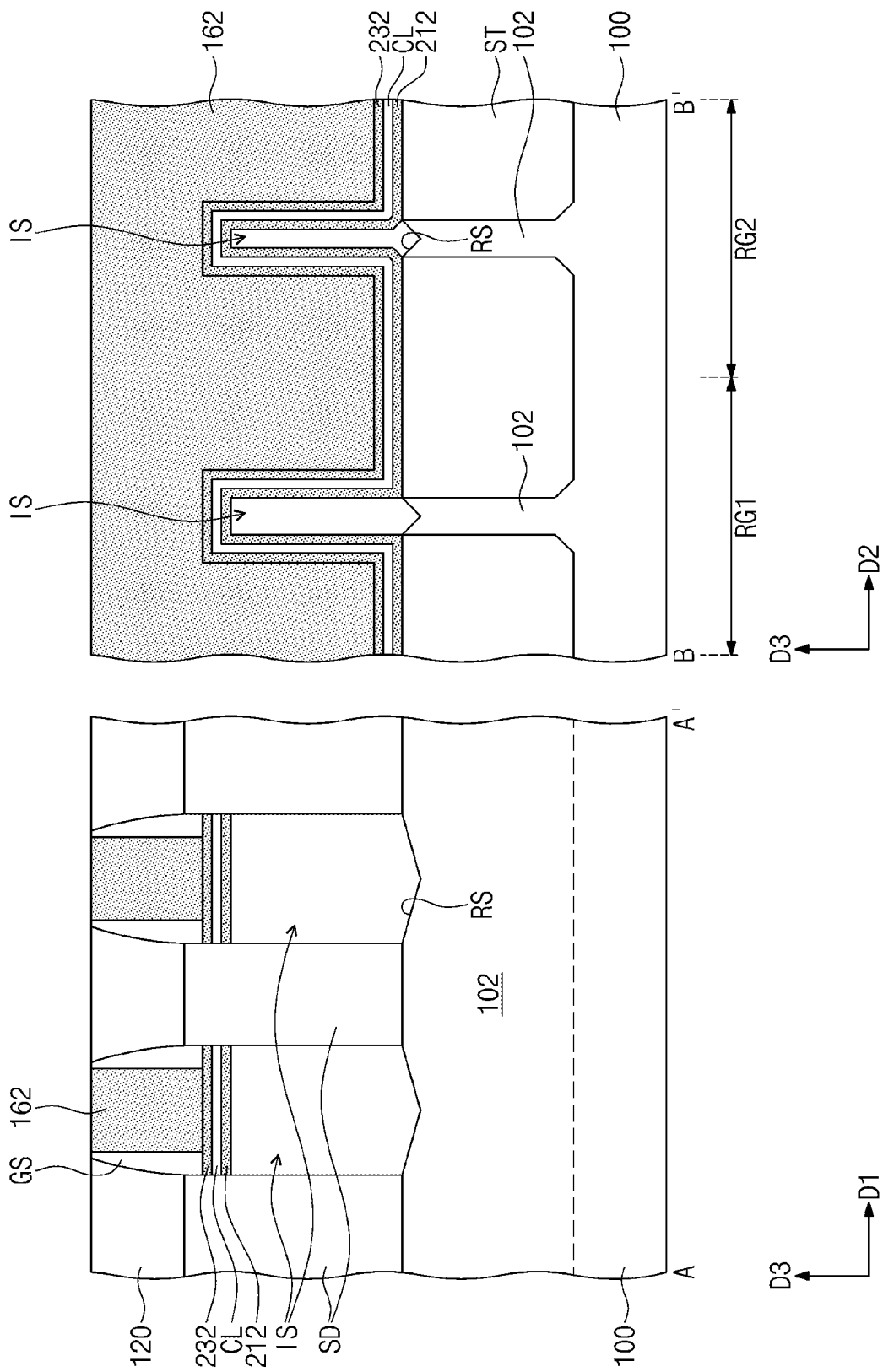

Referring to FIG. 13, an interlayer dielectric layer 120 may be formed on the entire surface of the substrate 100. The interlayer dielectric layer 120 may be formed to cover the sacrificial gate structures SGS. The interlayer dielectric layer 120 may be formed by using silicon oxide (SiO) or silicon oxynitride (SiON).

A planarization process may be performed on the interlayer dielectric layer 120 until top surfaces of the sacrificial gate patterns 162 are exposed. The planarization process may include an etch-back process and/or a chemical mechanical polishing (CMP) process. When the interlayer dielectric layer 120 is planarized, the gate mask patterns 164 may also be removed.

Thereafter, portions of the active patterns 154 may be selectively removed. For example, the active patterns 154 may have upper portions that are positioned beyond the top surface of the device isolation layer ST, and the upper portions of the active patterns 154 may be etched. The etching process may include a wet etching process. The active patterns 154 may have other portions that remain after the upper portions of the active patterns 154 are etched, and the other portions of the active patterns 154 may be the base active patterns 102 discussed with reference to FIG. 3. When the wet etching process is performed, the base active patterns 102 may be formed to have their top surfaces that are inclined depending on crystallinity of a material, such as silicon (Si), included in the substrate 100. For example, the top surfaces of the base active patterns 102 may be located at a level the same as or lower than that of the top surface of the device isolation layer ST, and each of the top surfaces of the base active patterns 102 may have a recessed portion RS that is recessed toward the substrate 100. The recessed portions RS may have their inclined surfaces that are inclined relative to the top surface of the device isolation layer ST.

Internal spaces IS, as used herein, may refer to spaces from which the upper portions of the active patterns 154 are removed. On the base active patterns 102, the internal spaces IS may be surrounded by the source/drain patterns SD and the first sacrificial patterns 212. When the active patterns 154 are etched, the first sacrificial patterns 212 may protect the channel layers CL.

Figure 14:
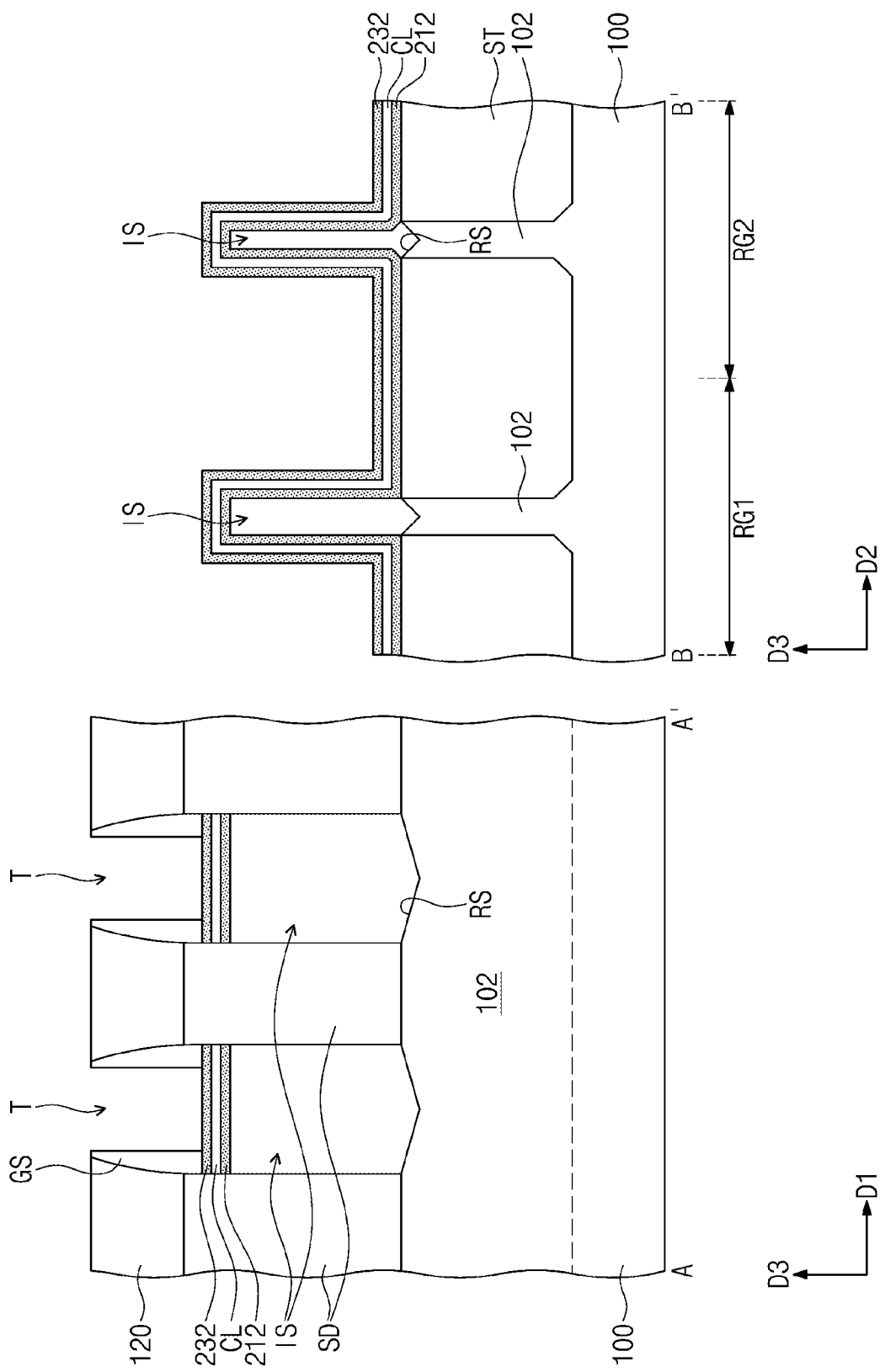

Referring to FIG. 14, a process may be performed to selectively remove the sacrificial gate patterns 162 exposed by the planarization process. The removal of the sacrificial gate patterns 162 may form trenches T on the substrate 100. The trenches T may be empty regions defined by the gate spacers GS. The trenches T may expose the second sacrificial patterns 232. When viewed in a plan view, the trenches T may have linear shapes that extend in the second direction D2.

When the sacrificial gate patterns 162 are etched, the second sacrificial patterns 232 may protect the channel layers CL.

Figure 15:
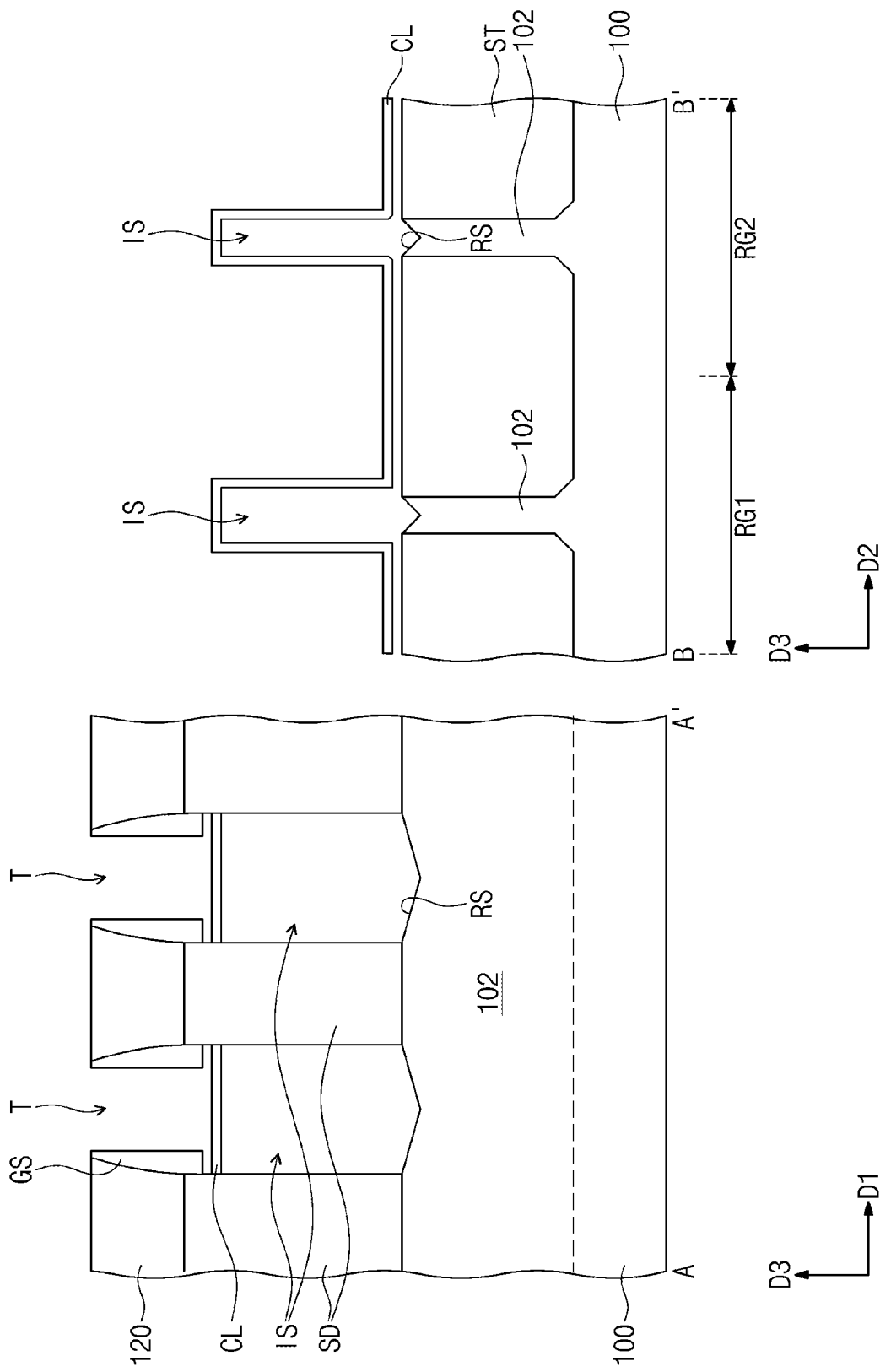

Referring to FIG. 15, a selective etching process may be performed to selectively remove the second sacrificial patterns 232 exposed to the trenches T and also to selectively remove the first sacrificial patterns 212 in the internal spaces IS. For example, when the first and second sacrificial patterns 212 and 232 include silicon-germanium (SiGe), when the channel layers CL include a two-dimensional semiconductor material, and when the base active patterns 102 include silicon (Si), the selective etching process may be performed by using an etchant that includes peracetic acid. The selective removal of the first and second sacrificial patterns 212 and 232 may expose top and bottom surfaces of the channel layers CL.

Figure 16:
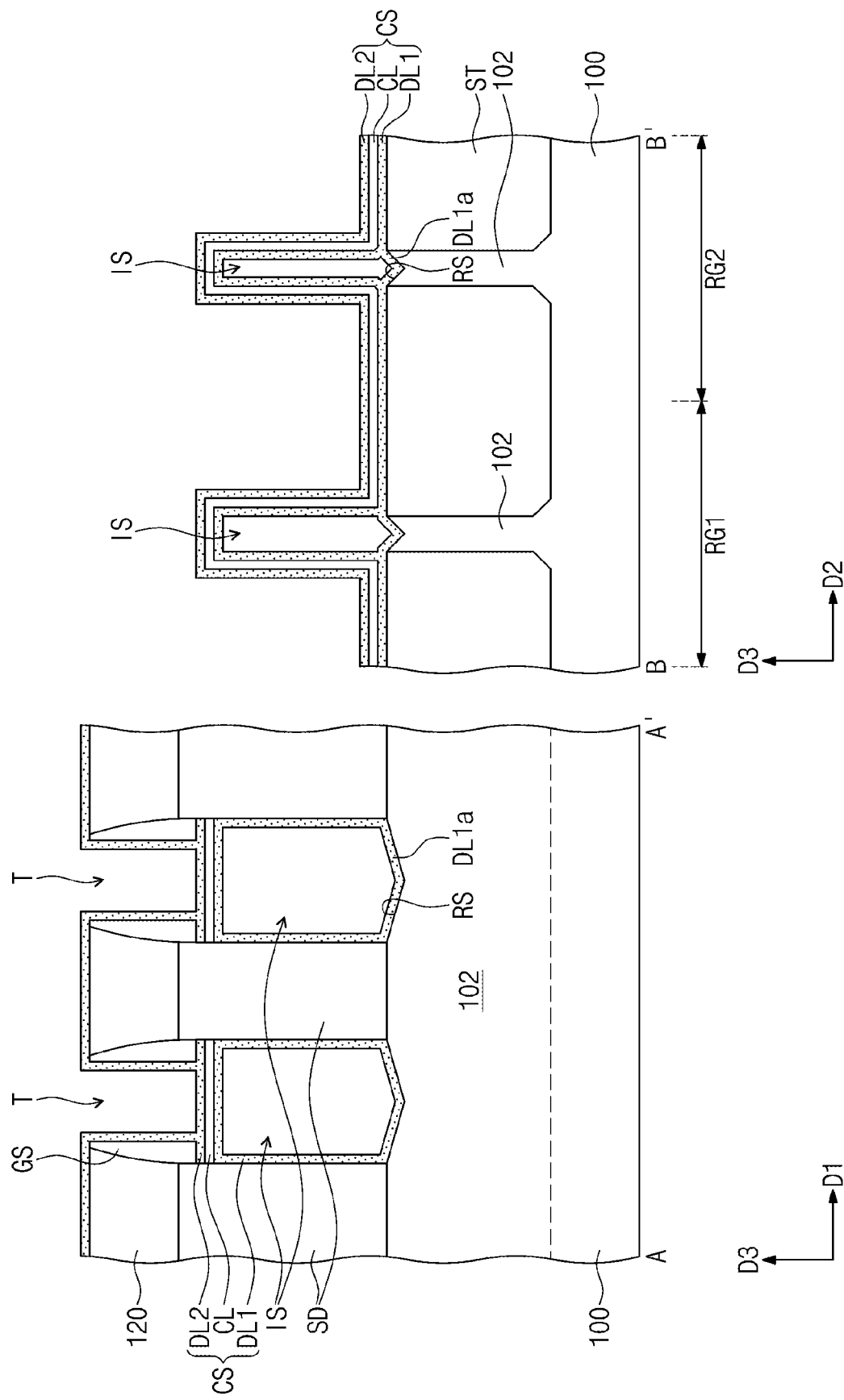

Referring to FIG. 16, first and second gate dielectric layers DL1 and DL2 may be formed on the channel layers CL exposed through the trenches T. An atomic layer deposition (ALD) process may be employed to form the first and second gate dielectric layers DL1 and DL2. The first and second gate dielectric layers DL1 and DL2 may directly cover the channel layers CL. For example, the first gate dielectric layers DL1 may be formed to conformally cover the bottom surfaces of the channel layers CL. In addition, the first gate dielectric layers DL1 may be formed to cover inner surfaces of the source/drain patterns SD and the top surfaces of the base active patterns 102. The second gate dielectric layers DL2 may be formed to cover and/or conform to the top surfaces of the channel layers CL. The first and second gate dielectric layers DL1 and DL2 may be formed by using a high-k dielectric material whose dielectric constant is greater than that of silicon oxide (SiO).

Figure 17:
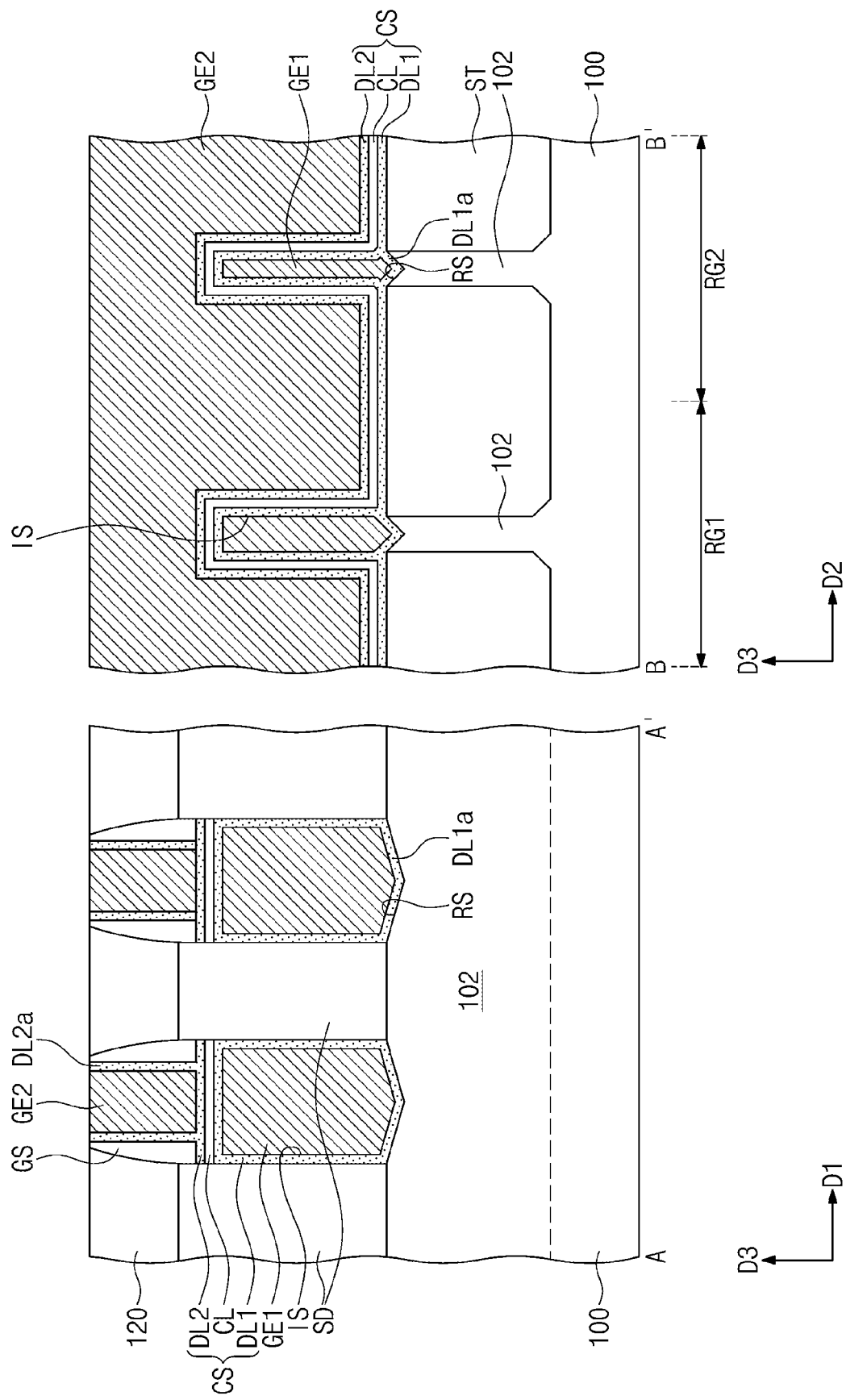

Referring to FIG. 17, first gate electrodes GE1 may be formed in the internal spaces IS, and second gate electrodes GE2 may be formed in the trenches T. The first gate electrodes GE1 may be formed inside the first gate dielectric layers DL1, and the second gate electrodes GE2 may be formed on the second gate dielectric layers DL2. The second gate electrodes GE2 may fill remaining portions of the trenches T. The first and second gate electrodes GE1 and GE2 may be formed by using a low-resistance metal. For example, a conductive material may be used to fill the inner spaces IS and the trenches T and to cover the interlayer dielectric layer 120, and then a planarization process may be performed until a top surface of the interlayer dielectric layer 120 is exposed. The planarization process may remove portions of the second gate dielectric layers DL2 deposited on the top surface of the interlayer dielectric layer 120.

Referring back to FIG. 3, an upper portion of the second gate electrode GE2 and an upper portion of the second gate dielectric layer DL2 may be recessed to form a groove between the gate spacers GS. A gate capping pattern GP may be formed in the groove. The formation of the gate capping pattern GP may include forming on the interlayer dielectric layer 120 a gate capping layer that fills the groove, and then planarizing the gate capping layer until the interlayer dielectric layer 120 is exposed. The gate capping layer may be formed by using silicon oxide (SiO), silicon nitride (SiN), or silicon oxynitride (SiON). The processes mentioned above may be utilized in a fabrication process of the semiconductor device discussed with reference to FIG. 3.

Figure 18:
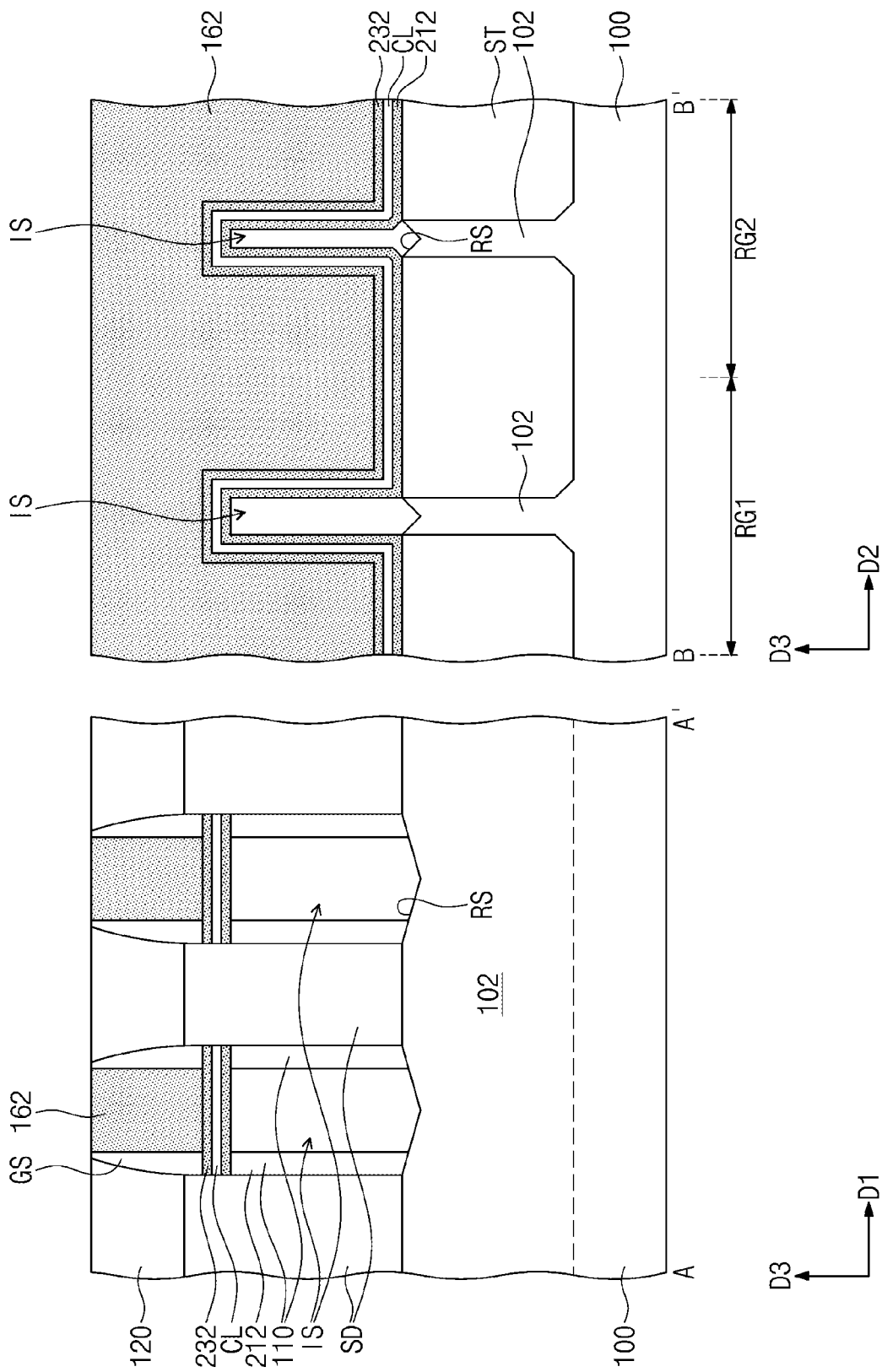
FIGS. 18 to 20 illustrate cross-sectional views showing aspects of a method of fabricating a semiconductor device according to some example embodiments of the present inventive concepts.
Figure 19:
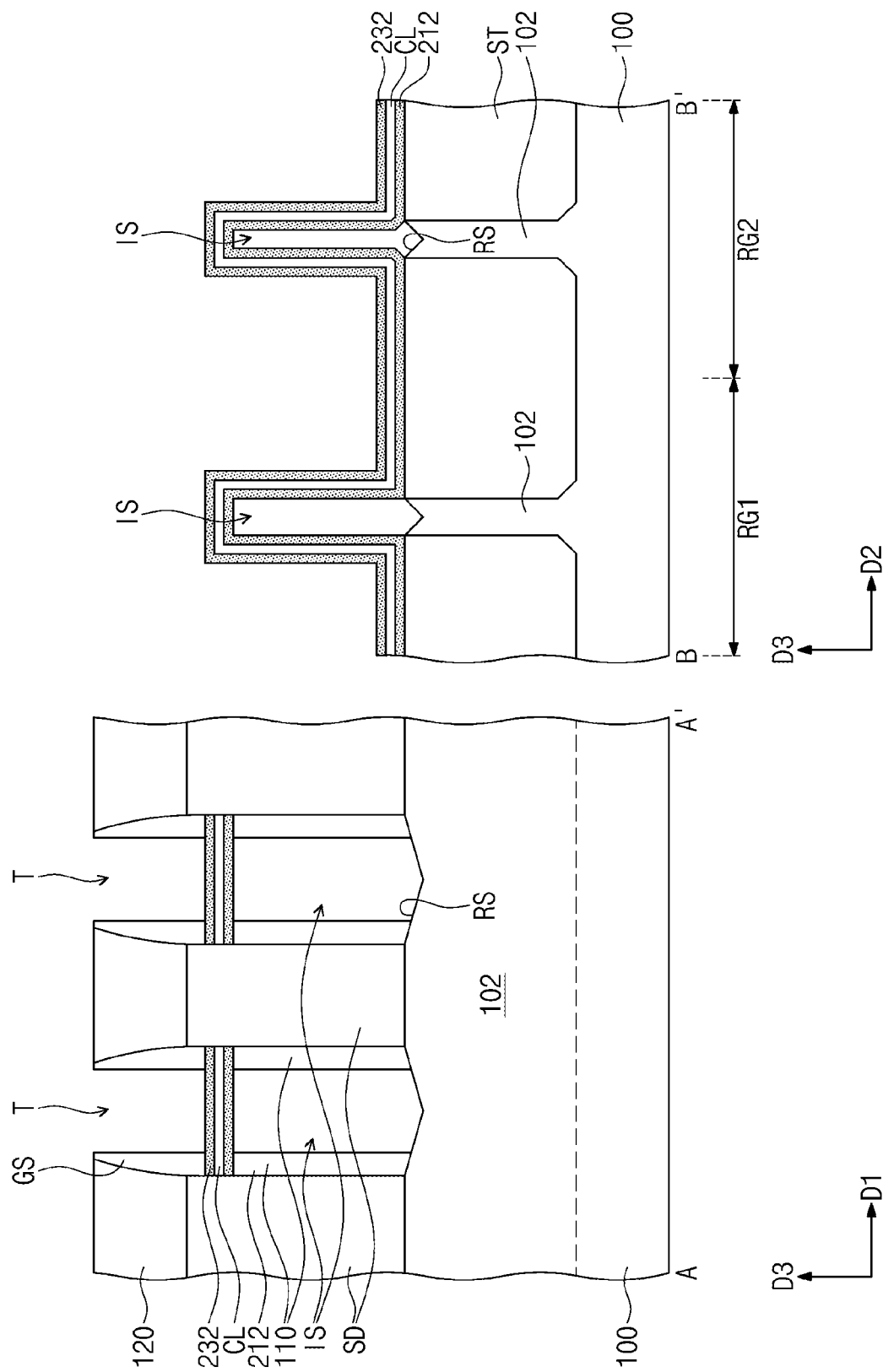
Figure 20:
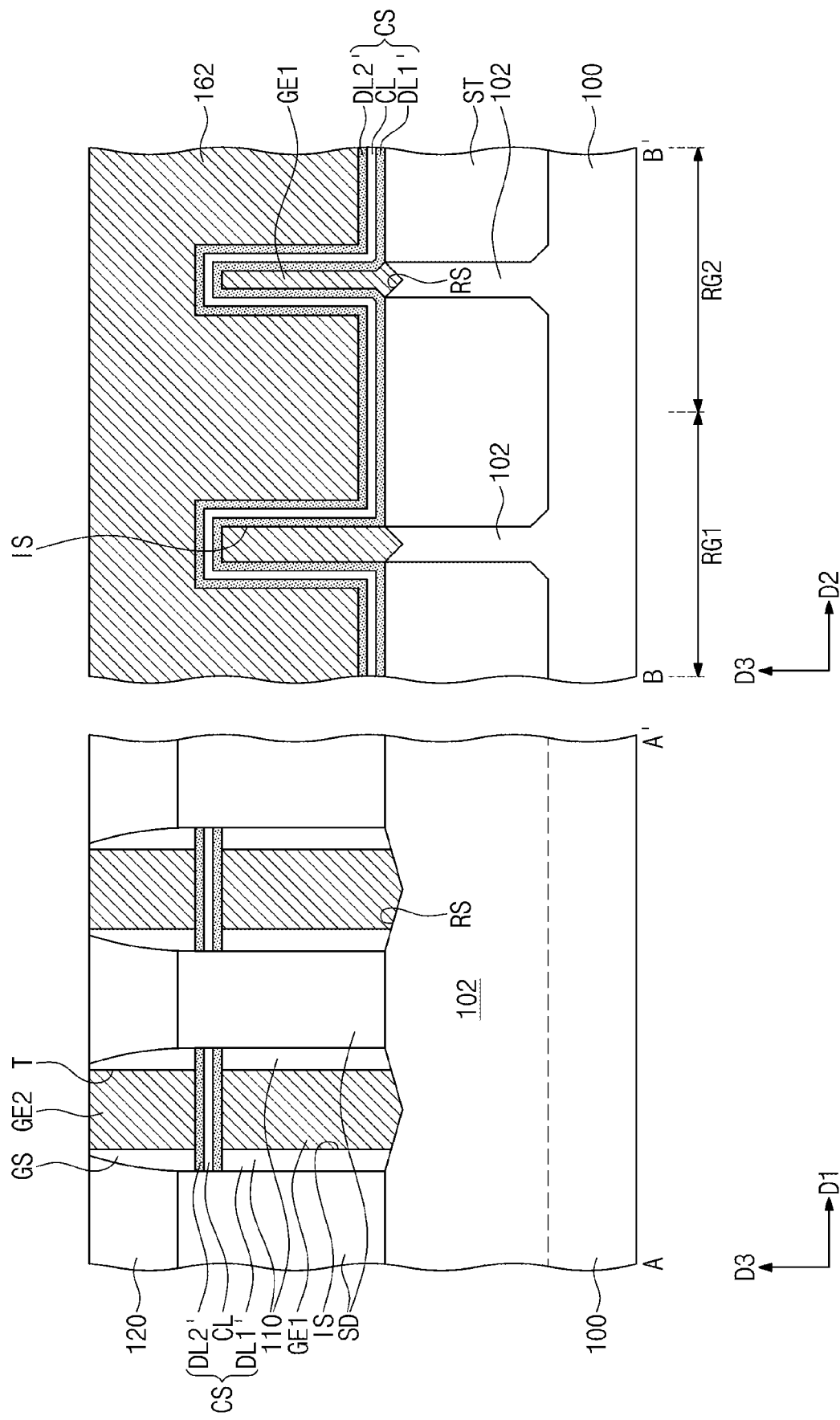

FIGS. 18 to 20 illustrate cross-sectional views showing aspects of a method of fabricating a semiconductor device according to some example embodiments of the present inventive concepts.

Referring to FIG. 18, spacer patterns 110 may be formed in the inner spaces IS shown in FIG. 13. The spacer patterns 110 may be formed on inner sidewalls of the source/drain patterns SD. For example, the spacer patterns 110 may be formed by oxidizing the inner sidewalls of the source/drain patterns SD or by depositing dielectric layers on the inner sidewalls of the source/drain patterns SD. When dielectric layers are deposited to form the spacer patterns 110, portions of the spacer patterns 110 may cover the top surfaces of the base active patterns 102 in the inner spaces IS.

Referring to FIG. 19, the sacrificial gate patterns 162 may be selectively removed. The removal of the sacrificial gate patterns 162 may form trenches T on the substrate 100. The trenches T may be empty regions defined by the gate spacers GS. The trenches T may expose the second sacrificial patterns 232. When viewed in a plan view, the trenches T may have linear shapes that extend in the second direction D2.

Referring to FIG. 20, first gate electrodes GE1 may be formed in the internal spaces IS, and second gate electrodes GE2 may be formed in the trenches T. The first gate electrodes GE1 may be formed inside the first sacrificial patterns (see 212 of FIG. 19), and the second gate electrodes GE2 may be formed on the second sacrificial patterns (see 232 of FIG. 19). The second gate electrodes GE2 may fill remaining portions of the trenches T. The first and second gate electrodes GE1 and GE2 may be formed by using a low-resistance metal. For example, a conductive material may be used to fill the inner spaces IS and the trenches T and to cover the interlayer dielectric layer 120, and then a planarization process may be performed until a top surface of the interlayer dielectric layer 120 is exposed.

The first sacrificial pattern (see 212 of FIG. 19) may be the first gate dielectric layer DL1' discussed with reference to FIG. 6, and the second sacrificial pattern (see 232 of FIG. 19) may be the second gate dielectric layer DL2' discussed with reference to FIG. 6.

Referring back to FIG. 6, an upper portion of the second gate electrode GE2 and an upper portion of the second gate dielectric layer DL2 may be recessed to form a groove between the gate spacers GS. A gate capping pattern GP may be formed in the groove. The formation of the gate capping pattern GP may include forming on the interlayer dielectric layer 120 a gate capping layer that fills the groove, and then planarizing the gate capping layer until the interlayer dielectric layer 120 is exposed. The processes mentioned above may be utilized in a fabrication process of the semiconductor device discussed with reference to FIG. 6.

FIGS. 21 to 25 illustrate cross-sectional views showing aspects of a method of fabricating a semiconductor device according to some example embodiments of the present inventive concepts.

Figure 21:
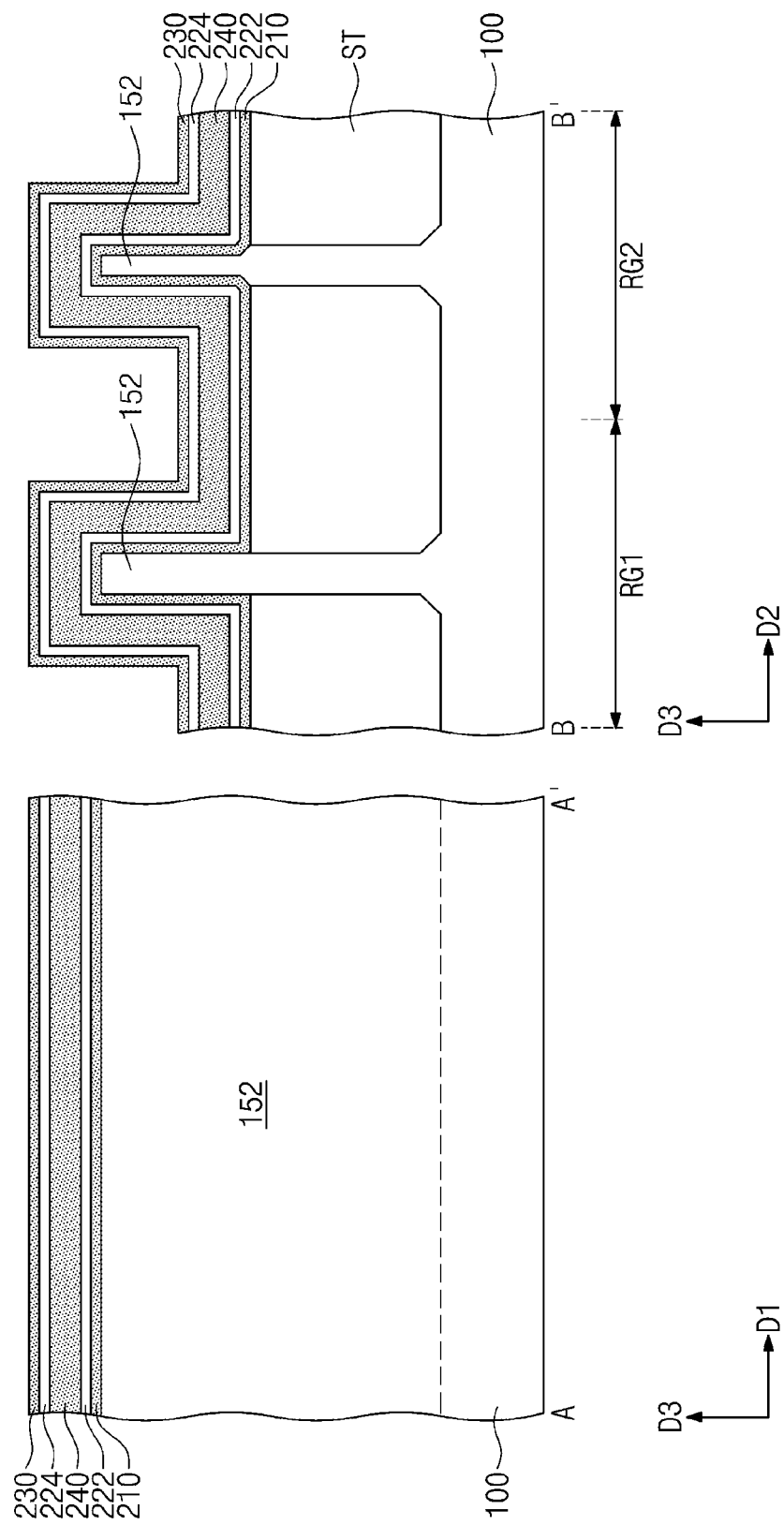
FIGS. 21 to 25 illustrate cross-sectional views showing aspects of a method of fabricating a semiconductor device according to some example embodiments of the present inventive concepts.

Referring to FIG. 21, a first sacrificial layer 210, a first channel layer 222, a third sacrificial layer 240, a second channel layer 224, and a second sacrificial layer 230 may be sequentially stacked on a resultant structure of FIG. 8. The first sacrificial layer 210, the first channel layer 222, the third sacrificial layer 240, the second channel layer 224, and the second sacrificial layer 230 may be formed to conform to the top surface of the substrate 100. For example, the first sacrificial layer 210, the first channel layer 222, the third sacrificial layer 240, the second channel layer 224, and the second sacrificial layer 230 may cover the top surface of the device isolation layer ST, the top surfaces of the preliminary active patterns 152, and the lateral surfaces each of the preliminary active patterns 152 that protrude beyond the device isolation layer ST. The third sacrificial layer 240 may be formed to have a thickness greater than that of the first sacrificial layer 210 and that of the second sacrificial layer 230. The first, second, and third sacrificial layers 210, 230, and 240 may include a material having an etch selectivity with respect to the device isolation layer ST, the preliminary active patterns 152, the first channel layer 222, and the second channel layer 224. The first and second channel layers 222 and 224 may include a two-dimensional semiconductor material.

Figure 22:
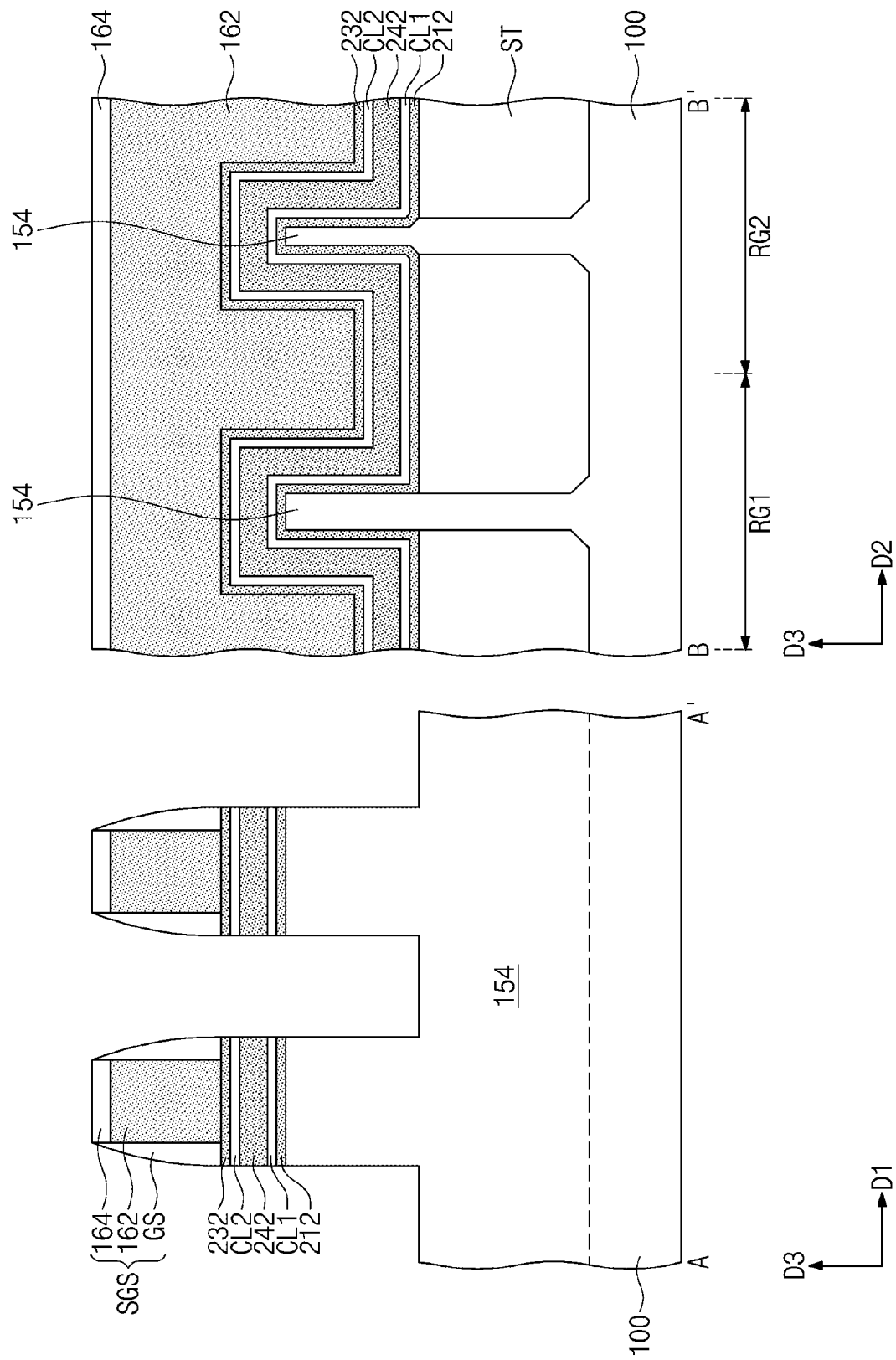

Referring to FIG. 22, sacrificial gate structures SGS may be formed on the second sacrificial layer 230. The second gate structures SGS may run across the preliminary active patterns (see 152 of FIG. 21), while extending in the second direction D2. Each of the sacrificial gate structures SGS may include a sacrificial gate pattern 162 and a gate mask pattern 164 that are sequentially stacked on the second sacrificial layer 230. The sacrificial gate pattern 162 and the gate mask pattern 164 may be formed by sequentially forming a sacrificial gate layer and a gate mask layer on the second sacrificial layer 230, and then sequentially patterning the sacrificial gate layer and the gate mask layer. The sacrificial gate structures SGS may have linear shapes that extend in the second direction D2. The sacrificial gate structures SGS may further include gate spacers GS. A pair of gate spacers GS may be formed on opposite sidewalls of each of the sacrificial gate structures SGS.

The second sacrificial layer 230, the second channel layer 224, the third sacrificial layer 240, the first channel layer 222, and the first sacrificial layer 210 may be patterned to form second sacrificial patterns 232, second channel layers CL2, third sacrificial patterns 242, first channel layers CL1, and first sacrificial patterns 212. For example, the gate mask patterns 164 and the gate spacers GS may be used as an etching mask to sequentially pattern the second sacrificial layer 230, the second channel layer 224, the third sacrificial layer 240, the first channel layer 222, and the first sacrificial layer 210.

When the patterning process is performed, the preliminary active patterns 152 may also be partially etched to form active patterns 154. The active patterns 154 may be formed so as to be at a level the same as or higher than that of the top surface of the device isolation layer ST.

Figure 23:
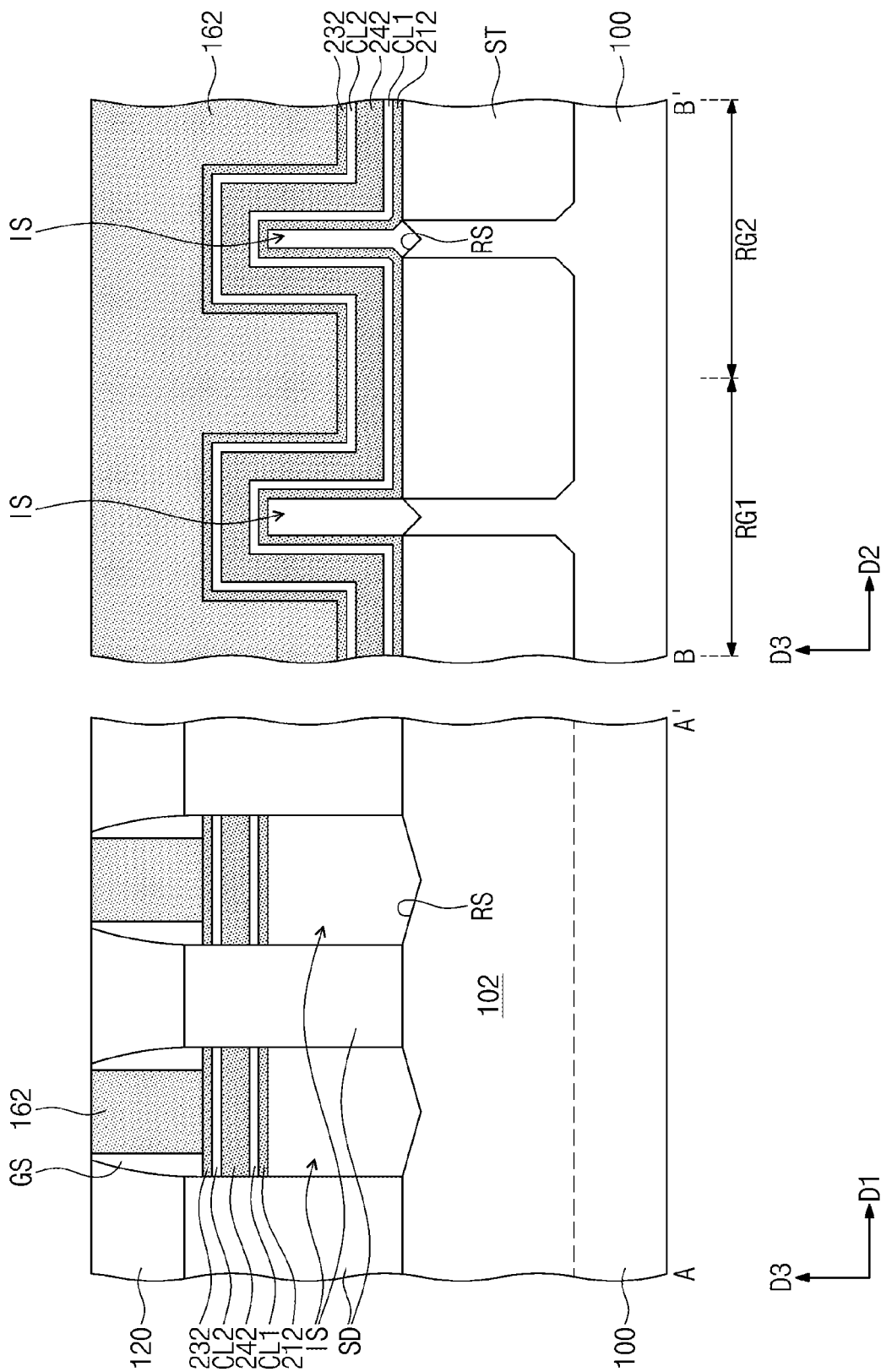

Referring to FIG. 23, source/drain patterns SD may be formed on opposite sides of each of the first and second channel layers CL1 and CL2. For example, the source/drain patterns SD may be formed by performing a selective epitaxial process in which the active patterns (see 154 of FIG. 22) are used as seeds. The first and second channel layers CL1 and CL2 may be connected to the source/drain patterns SD.

In some example embodiments, the source/drain patterns SD may be formed of a semiconductor element (e.g., silicon (Si)) the same as that of the active patterns 154. Simultaneously with or after the selective epitaxial process, the source/drain patterns SD may be doped with N-type impurities. Simultaneously with or after the selective epitaxial growth process, the source/drain patterns SD may be doped with P-type impurities.

An interlayer dielectric layer 120 may be formed on the entire surface of the substrate 100. The interlayer dielectric layer 120 may be formed to cover the sacrificial gate structures (see SGS of FIG. 22). The interlayer dielectric layer 120 may be formed by using silicon oxide (SiO) or silicon oxynitride (SiON).

A planarization process may be performed on the interlayer dielectric layer 120 until top surfaces of the sacrificial gate patterns 162 are exposed. The planarization process may include an etch-back process and/or a chemical mechanical polishing (CMP) process. When the interlayer dielectric layer 120 is planarized, the gate mask patterns 164 may also be removed.

Thereafter, portions of the active patterns 154 may be selectively removed. For example, the active patterns 154 may have upper portions that are positioned beyond the top surface of the device isolation layer ST, and the upper portions of the active patterns 154 may be etched. The etching process may include a wet etching process. The active patterns 154 may have other portions that remain after the upper portions of the active patterns 154 are etched, and the other portions of the active patterns 154 may be the base active patterns 102 discussed with reference to FIG. 3. When the wet etching process is performed, each of the base active patterns 102 may be formed to have on its top surface a recessed portion RS that is recessed toward the substrate 100. The recessed portions RS may have their inclined surfaces that are inclined relative to the top surface of the device isolation layer ST.

Internal spaces IS be formed as spaces from which the upper portions of the active patterns 154 are removed. On the base active patterns 102, the internal spaces IS may be surrounded by the source/drain patterns SD and the first sacrificial patterns 212.

Figure 24:
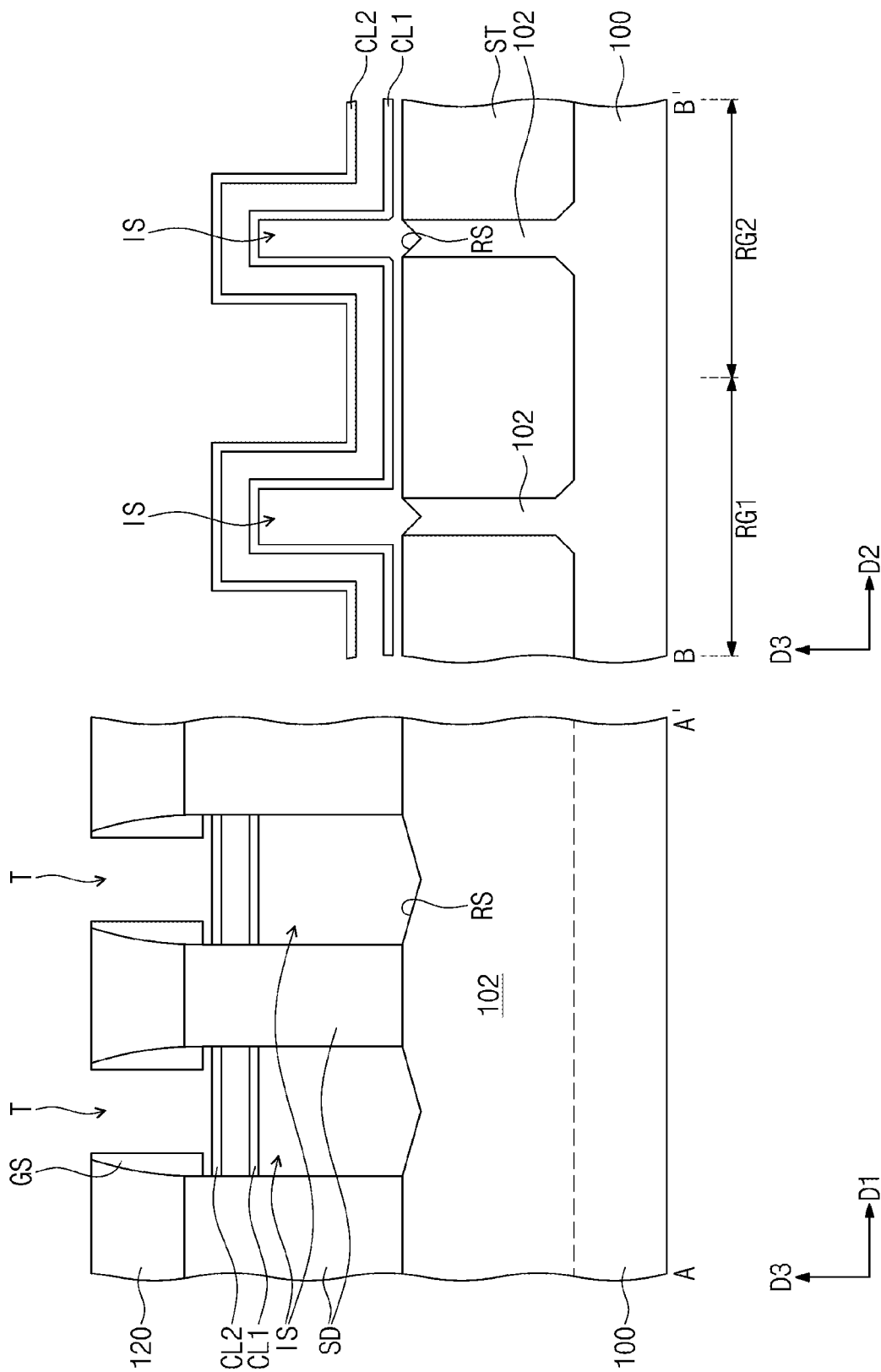

Referring to FIG. 24, a process may be performed to selectively remove the sacrificial gate patterns 162 exposed by the planarization process. The removal of the sacrificial gate patterns 162 may form trenches T on the substrate 100. The trenches T may be empty regions defined by the gate spacers GS. The trenches T may expose the second sacrificial patterns 232. When viewed in a plan view, the trenches T may have linear shapes that extend in the second direction D2.

The second sacrificial patterns 232 may be selectively removed which are exposed to the trenches T, and the first and third sacrificial patterns 212 and 242 may be selectively removed from the inner spaces IS. For example, the first, second, and third sacrificial patterns 212, 232, and 242 may be selectively removed to expose top and bottom surfaces of the first and second channel layers CL1 and CL2.

Figure 25:
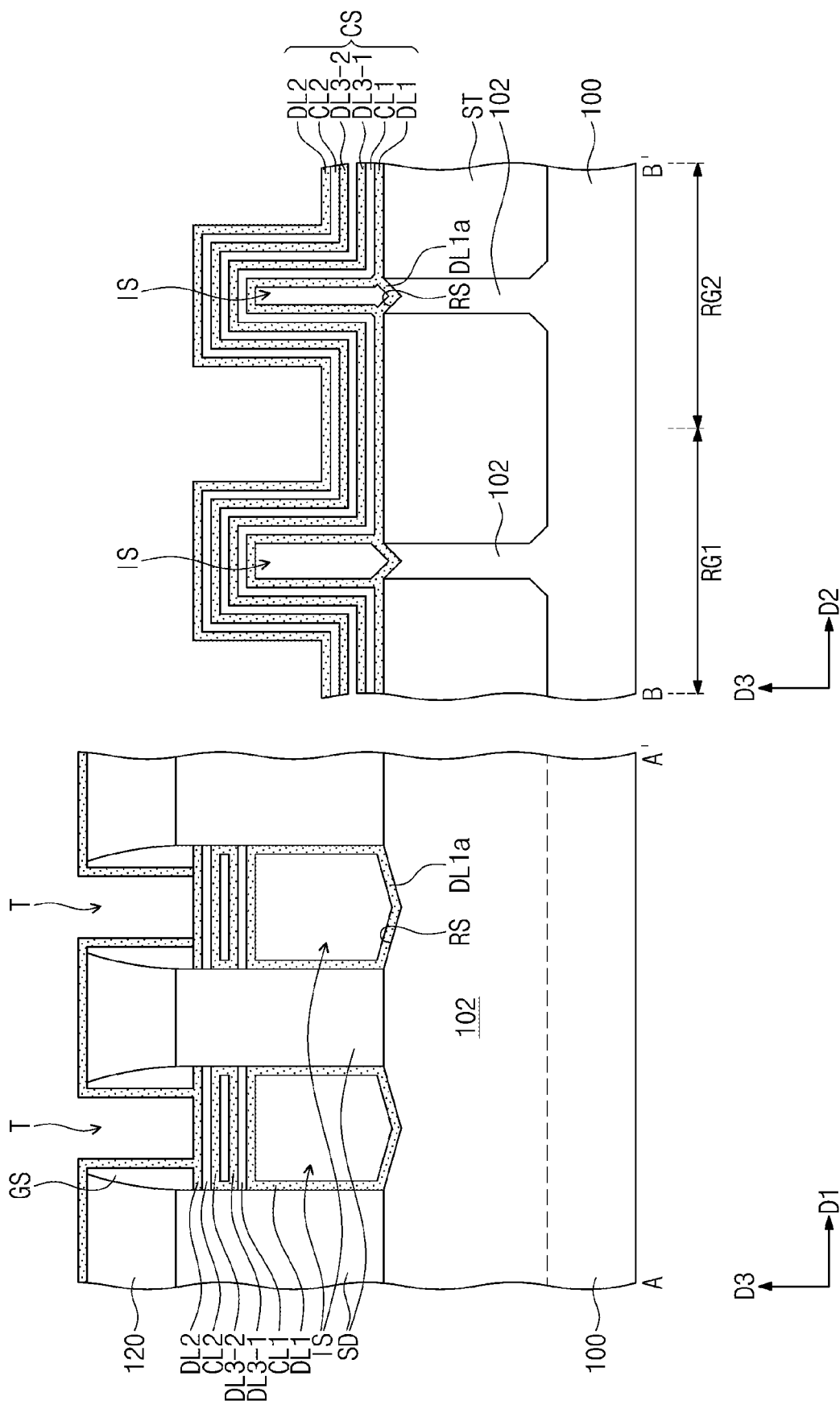

Referring to FIG. 25, first gate dielectric layers DL1, first middle gate dielectric layers DL3-1, second middle gate dielectric layers DL3-2, and second gate dielectric layers DL2 may be formed on the first and second channel layers CL1 and CL2 exposed through the trenches T. The first gate dielectric layers DL1 and the first middle gate dielectric layers DL3-1 may directly cover the first channel layers CL1. For example, the first gate dielectric layers DL1 may be formed to cover and/or conform to bottom surfaces of the first channel layers CL1, and the first middle gate dielectric layers DL3-1 may be formed to cover and/or conform top surfaces of the first channel layers CL1. The second middle gate dielectric layers DL3-2 and the second gate dielectric layers DL2 may directly cover the second channel layers CL2. For example, the second middle gate dielectric layers DL3-2 may be formed to cover and/or conform to bottom surfaces of the second channel layers CL2, and the second gate dielectric layers DL2 may be formed to cover and/or conform to top surfaces of the second channel layers CL2. The first middle gate dielectric layers DL3-1 and the second middle gate dielectric layers DL3-2 may be formed to be spaced apart from each other in a third direction D3. The first middle gate dielectric layers DL3-1 and the second middle gate dielectric layers DL3-2 may be connected to each other on the inner surfaces of the source/drain patterns SD.

Referring back to FIG. 5, first gate electrodes GE1 may be formed in the inner spaces IS, and second gate electrodes GE2 may be formed in the trenches T. Third gate electrodes GE3 may be formed in spaces between the first middle gate dielectric layers DL3-1 and the second middle gate dielectric layers DL3-2. For example, a conductive material may be used to fill the inner spaces IS, the trenches T, and spaces between the first middle gate dielectric layers DL3-1 and the second middle gate dielectric layers DL3-2 and to cover the interlayer dielectric layer 120, and then a planarization process may be performed until a top surface the interlayer dielectric layer 120 is exposed. The planarization process may remove portions of the second gate dielectric layers DL2 deposited on the top surface of the interlayer dielectric layer 120.

An upper portion of the second gate electrode GE2 and an upper portion of the second gate dielectric layer DL2 may be recessed to form a groove between the gate spacers GS. A gate capping pattern GP may be formed in the groove. The formation of the gate capping pattern GP may include forming on the interlayer dielectric layer 120 a gate capping layer that fills the groove, and then planarizing the gate capping layer until the interlayer dielectric layer 120 is exposed.

The processes mentioned above may be utilized in a fabrication process of the semiconductor device discussed with reference to FIG. 5.

According to some example embodiments of the present inventive concepts, a semiconductor device may include a gate-all-around type field effect transistor that includes a channel region whose outer surface is surrounded by first and second gate electrodes, and the semiconductor device may exhibit an increase and/or an improvement in desired electrical characteristics.

In addition, a three-dimensional structure may be achieved in which a channel layer covers top and lateral surfaces of the first gate electrode, and thus the channel layer may have a large area on a narrow region. Accordingly, a channel formed at the channel layer may have low resistance and high charge mobility. As a result, the semiconductor device may have increased and/or improved gate controllability.

Moreover, the channel layers of the transistors may have different areas from each other, and widths of the first gate electrodes of the transistors may be used to adjust more easily the effective work functions of the transistors.

Although the present inventive concepts have been described in connection with some example embodiments of the present inventive concepts illustrated in the accompanying drawings, it will be understood by one of ordinary skill in the art that variations in form and detail may be made therein without departing from the present inventive concepts. The above disclosed embodiments should thus be considered illustrative and not restrictive.

What is claimed is:

1. A semiconductor device, comprising:
a first gate electrode on a substrate, the first gate electrode extending in a first direction and having a top surface and lateral surfaces extending in the first direction;
a second gate electrode on the substrate, the second gate electrode running across the first gate electrode and extending in a second direction, the second gate electrode covering at least portions of the lateral surfaces and the top surface of the first gate electrode; and
a channel structure between the second gate electrode and the lateral surfaces of the first gate electrode and between the second gate electrode and the top surface of the first gate electrode,
wherein the channel structure includes:
a first dielectric layer in contact with the lateral surfaces and the top surface of the first gate electrode;
a second dielectric layer in contact with the second gate electrode; and a channel layer between the first dielectric layer and the second dielectric layer.

2. The semiconductor device of claim 1, wherein the channel layer includes a two-dimensional semiconductor material.

3. The semiconductor device of claim 1, wherein the channel structure is Π-shaped when viewed in a cross-sectional view taken along a plane perpendicular to the first direction.

4. The semiconductor device of claim 1, wherein the channel layer is a first channel layer, wherein the channel structure further comprises a second channel layer and a third dielectric layer between the first and second channel layers, and wherein the first channel layer, the third dielectric layer, and the second channel layer are sequentially stacked in a direction from the first dielectric layer toward the second dielectric layer.

5. The semiconductor device of claim 4, wherein the third dielectric layer includes:
 a first sub-dielectric layer in contact with the first channel layer; and
 a second sub-dielectric layer in contact with the second channel layer,
 wherein the semiconductor device further includes a third gate electrode between the first sub-dielectric layer and the second sub-dielectric layer.

6. The semiconductor device of claim 1, further comprising a plurality of source/drain patterns on the substrate,
 wherein the source/drain patterns are spaced apart in the first direction from each other across the first gate electrode, and
 wherein the channel layer connects the source/drain patterns to each other.

7. The semiconductor device of claim 1, wherein the substrate includes an active pattern on an upper portion of the substrate, the active pattern having a fin shape that extends in the first direction,
 wherein the first gate electrode is on the active pattern.

8. The semiconductor device of claim 7, wherein, at an interface between the first gate electrode and the active pattern, the lateral surfaces of the first gate electrode are vertically aligned with lateral surfaces of the active pattern.

9. The semiconductor device of claim 7, wherein a lowermost end of the channel structure is at a level lower than a level of a top surface of the active pattern.

10. The semiconductor device of claim 7, wherein the first dielectric layer is between the active pattern and the first gate electrode.

11. The semiconductor device of claim 7, wherein a top surface of the active pattern has a recessed shape directed into the active pattern, and wherein the first gate electrode contacts the top surface of the active pattern.

12. A semiconductor device, comprising:
 an active pattern that extends in a first direction on a substrate;
 a first gate electrode that extends in the first direction on the active pattern;
 a second gate electrode that runs across the first gate electrode and that covers lateral surfaces and a top surface of the first gate electrode;
 a plurality of gate spacers that cover lateral surfaces of the second gate electrode;
 a first channel layer between the first gate electrode and the second gate electrode;
 a plurality of dielectric layers between the first channel layer and the first gate electrode and between the first channel layer and the second gate electrode; and
 a plurality of source/drain patterns that are spaced apart from each other across the first gate electrode and are connected to other through the first channel layer.

13. The semiconductor device of claim 12, wherein the first channel layer includes a two-dimensional semiconductor material.

14. The semiconductor device of claim 12, wherein the first channel layer is Π-shaped when viewed in a cross-sectional view taken along a plane perpendicular to the first direction.

15. The semiconductor device of claim 12, further comprising a second channel layer between the second gate electrode and the first channel layer,
 wherein the dielectric layers are between the first channel layer and the first gate electrode, between the first channel layer and the second channel layer, and between the second channel layer and the second gate electrode.

16. The semiconductor device of claim 15, further comprising a third gate electrode between the first channel layer and the second channel layer, wherein the dielectric layers separate the third gate electrode from the first channel layer and the second channel layer.

17. The semiconductor device of claim 12, wherein, at an interface between the first gate electrode and the active pattern, the lateral surfaces of the first gate electrode are vertically aligned with lateral surfaces of the active pattern.

18. The semiconductor device of claim 17, wherein a top surface of the active pattern has a recessed shape directed into the active pattern, and wherein the first gate electrode contacts the top surface of the active pattern.

19. A semiconductor device, comprising:
 a first active pattern and a second active pattern that extend in a first direction on a substrate and are spaced apart from each other in a second direction that intersects the first direction;
 a first gate electrode that extends in the first direction on the first active pattern;
 a second gate electrode that extends in the first direction on the second active pattern;
 a third gate electrode that extends across the first gate electrode and the second gate electrode;
 a channel layer between the first gate electrode and the third gate electrode and between the second gate electrode and the third gate electrode, wherein the channel layer covers lateral surfaces and a top surface of the first gate electrode and lateral surfaces and a top surface of the second gate electrode;
 a first dielectric layer between the channel layer and the first gate electrode and between the channel layer and the second gate electrode; and
 a second dielectric layer between the channel layer and the third gate electrode.

* * * * *